(12) United States Patent
Stuber

(10) Patent No.: US 9,478,507 B2
(45) Date of Patent: Oct. 25, 2016

(54) INTEGRATED CIRCUIT ASSEMBLY WITH FARADAY CAGE

(71) Applicant: QUALCOMM Incorporated, San Diego, CA (US)

(72) Inventor: Michael A. Stuber, Carlsbad, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 14/596,515

(22) Filed: Jan. 14, 2015

(65) Prior Publication Data
US 2015/0137307 A1    May 21, 2015

Related U.S. Application Data

(63) Continuation-in-part of application No. 14/272,261, filed on May 7, 2014, which is a continuation of application No. 13/851,926, filed on Mar. 27, 2013, now Pat. No. 8,748,245.

(51) Int. Cl.
*H01L 23/52* (2006.01)
*H01L 21/70* (2006.01)
(Continued)

(52) U.S. Cl.
CPC .............. *H01L 23/60* (2013.01); *H01L 21/84* (2013.01); *H01L 23/5225* (2013.01); *H01L 27/1203* (2013.01); *H01L 23/481* (2013.01); *H01L 2924/0002* (2013.01)

(58) Field of Classification Search
USPC .................. 257/503, 369, 758, 773
See application file for complete search history.

(56) References Cited

U.S. PATENT DOCUMENTS

| 4,505,799 A | 3/1985 | Baxter |
| 4,819,037 A | 4/1989 | Sakakibara et al. |

(Continued)

FOREIGN PATENT DOCUMENTS

| CN | 1470073 A | 1/2004 |
| CN | 1729578 A | 2/2006 |

OTHER PUBLICATIONS

Notice of Allowance dated May 15, 2015 for U.S. Appl. No. 13/860,371.

(Continued)

*Primary Examiner* — Marc Armand
*Assistant Examiner* — Wilner Jean Baptiste
(74) *Attorney, Agent, or Firm* — Haynes and Boone, LLP

(57) ABSTRACT

An integrated circuit assembly is formed with an insulating layer, a semiconductor layer, an active device, first, second, and third electrically conductive interconnect layers, and a plurality of electrically conductive vias. The insulating layer has a first surface and a second surface. The second surface is below the first surface. A substrate layer has been removed from the second surface. The semiconductor layer has a first surface and a second surface. The first surface of the semiconductor layer contacts the first surface of the insulating layer. The active device is formed in a region of the semiconductor layer. The first electrically conductive interconnect layer forms an electrically conductive ring. The second electrically conductive interconnect layer forms a first electrically conductive plate above the electrically conductive ring and the region of the semiconductor layer. The third electrically conductive interconnect layer forms a second electrically conductive plate below the electrically conductive ring and the region of the semiconductor layer. The plurality of electrically conductive vias electrically couple the electrically conductive ring to the first electrically conductive plate and to the second electrically conductive plate. The electrically conductive ring, the first electrically conductive plate, the second electrically conductive plate, and the plurality of electrically conductive vias form a Faraday cage around the active device.

10 Claims, 11 Drawing Sheets

(51) Int. Cl.
*H01L 23/48* (2006.01)
*H01L 29/40* (2006.01)
*H01L 23/60* (2006.01)
*H01L 21/84* (2006.01)
*H01L 27/12* (2006.01)
*H01L 23/522* (2006.01)

(56) References Cited

U.S. PATENT DOCUMENTS

| | | | |
|---|---|---|---|
| 4,897,123 A | 1/1990 | Mitsui | |
| 4,959,697 A | 9/1990 | Shier et al. | |
| 5,048,937 A * | 9/1991 | Takeda | G02F 1/092 333/24.1 |
| 5,122,856 A | 6/1992 | Komiya | |
| 5,198,379 A | 3/1993 | Adan | |
| 5,212,397 A | 5/1993 | See et al. | |
| 5,266,515 A | 11/1993 | Robb et al. | |
| 5,571,741 A | 11/1996 | Leedy | |
| 5,580,802 A | 12/1996 | Mayer et al. | |
| 5,593,915 A | 1/1997 | Ohoka | |
| 5,619,054 A | 4/1997 | Hashimoto | |
| 5,907,169 A | 5/1999 | Hshieh et al. | |
| 6,004,837 A | 12/1999 | Gambino et al. | |
| 6,060,746 A | 5/2000 | Bertin et al. | |
| 6,084,284 A | 7/2000 | Adamic, Jr. | |
| 6,130,457 A | 10/2000 | Yu et al. | |
| 6,143,582 A | 11/2000 | Vu et al. | |
| 6,153,912 A | 11/2000 | Holst | |
| 6,335,214 B1 | 1/2002 | Fung | |
| 6,337,505 B2 | 1/2002 | Hwang et al. | |
| 6,346,446 B1 | 2/2002 | Ritenour | |
| 6,515,870 B1 | 2/2003 | Skinner et al. | |
| 6,521,940 B1 | 2/2003 | Vu et al. | |
| 6,611,023 B1 | 8/2003 | En et al. | |
| 6,700,160 B1 | 3/2004 | Merchant | |
| 6,753,579 B2 | 6/2004 | Baba | |
| 6,903,918 B1 | 6/2005 | Brennan | |
| 6,927,102 B2 | 8/2005 | Udrea et al. | |
| 7,205,587 B2 | 4/2007 | Fujimaki | |
| 7,250,347 B2 | 7/2007 | Furukawa et al. | |
| 7,427,803 B2 | 9/2008 | Chao et al. | |
| 7,491,588 B2 | 2/2009 | Campbell et al. | |
| 7,525,151 B2 | 4/2009 | Haase | |
| 7,576,404 B2 | 8/2009 | Wilson et al. | |
| 7,638,836 B2 | 12/2009 | Walker | |
| 7,651,897 B2 | 1/2010 | Vashchenko et al. | |
| 7,719,033 B2 | 5/2010 | Jeong et al. | |
| 8,030,145 B2 | 10/2011 | Chang et al. | |
| 8,072,006 B1 | 12/2011 | Hackler et al. | |
| 8,384,425 B2 | 2/2013 | Mazure et al. | |
| 8,415,743 B2 | 4/2013 | Cai et al. | |
| 8,426,888 B2 | 4/2013 | Molin et al. | |
| 8,518,758 B2 | 8/2013 | Yang et al. | |
| 8,530,287 B2 | 9/2013 | Cai et al. | |
| 8,581,349 B1 | 11/2013 | Sekar et al. | |
| 8,642,416 B2 | 2/2014 | Or-Bach et al. | |
| 8,664,712 B2 | 3/2014 | Mazure et al. | |
| 8,748,245 B1 | 6/2014 | Stuber et al. | |
| 8,928,068 B2 | 1/2015 | Molin et al. | |
| 2003/0017646 A1 | 1/2003 | Sridharan et al. | |
| 2004/0061163 A1 | 4/2004 | Nakayama | |
| 2004/0106335 A1 | 6/2004 | Nemoto et al. | |
| 2004/0113051 A1 | 6/2004 | Kim et al. | |
| 2004/0119076 A1 | 6/2004 | Ryu | |
| 2005/0242369 A1 | 11/2005 | Udrea et al. | |
| 2005/0253175 A1 | 11/2005 | Taddiken | |
| 2006/0043436 A1 | 3/2006 | Fan et al. | |
| 2006/0068532 A1 | 3/2006 | Schuele et al. | |
| 2006/0255434 A1 | 11/2006 | Degani et al. | |
| 2007/0152269 A1 | 7/2007 | Haase | |
| 2007/0284360 A1 | 12/2007 | Santoruvo et al. | |
| 2007/0284628 A1 | 12/2007 | Kapoor | |
| 2008/0054313 A1 | 3/2008 | Dyer et al. | |
| 2008/0315375 A1 | 12/2008 | Eichelberger et al. | |
| 2009/0050969 A1 | 2/2009 | Takasu | |
| 2009/0194817 A1 | 8/2009 | Lee et al. | |
| 2010/0078776 A1 | 4/2010 | Barth et al. | |
| 2010/0230735 A1 | 9/2010 | Zhu | |
| 2010/0314726 A1 | 12/2010 | Mueller et al. | |
| 2010/0315110 A1 * | 12/2010 | Fenner | H01L 23/3107 324/750.24 |
| 2010/0315580 A1 | 12/2010 | Cho et al. | |
| 2011/0012199 A1 | 1/2011 | Nygaard et al. | |
| 2011/0201175 A1 * | 8/2011 | Barth | H01L 23/552 438/454 |
| 2011/0254092 A1 | 10/2011 | Yang et al. | |
| 2012/0088339 A1 | 4/2012 | Molin et al. | |
| 2012/0231620 A1 | 9/2012 | Kuroda | |
| 2013/0049215 A1 | 2/2013 | Larsen | |
| 2014/0291860 A1 | 10/2014 | Stuber et al. | |
| 2014/0327077 A1 | 11/2014 | Stuber et al. | |
| 2014/0342529 A1 | 11/2014 | Goktepeli et al. | |

OTHER PUBLICATIONS

Office Action dated Aug. 4, 2015 for U.S. Appl. No. 14/451,342.
Notice of Allowance for U.S. Appl. No. 14/824,491, mailed Oct. 5, 2015, 57 pages.
Berriah et al, Thermal Analysis of a Miniature Electronic Power Device Matched to a Silicon Wafer, NEWCAS Conference, 2010 8th IEEE International, Jun. 20-23, 2010, pp. 129-132.
Burns et al., Three-Dimensional Integrated Circuits for Low-Power, High-Bandwidth Systems on a Chip, Solid-State Circuits Conference, Feb. 2001, Digest of Technical Papers, pp. 268-276.
Chen et al., Effects of Through-BOX Vias on SOI MOSFETs, VLSI Technology, Systems and Applications, IEEE, Apr. 21-23, 2008, pp. 95-96.
Chung et al., "A New SOI MOSFET Structure with Junction Type Body Contact", School of Electrical Engineering & ISRC, Electron Devices Meeting, Dec. 1999, pp. 59-62, Seaoul National University, Kwanak-Gu, Seoul Korea.
Chung, Y. et al., "SOI MOSFET Structure with a Junction-Type Body Contact for Suppression of Pass Gate Leakage", IEEE Transactions on Electron Devices, Jul. 2011, pp. 1360-1365, vol. 48, No. 7.
International Search Report and Written Opinion dated Aug. 4, 2014 for PCT Patent Application No. PCT/US2014/030553.
International Search Report dated May 11, 2012 for PCT Application PCT/US2011/055671.
Notice of Allowance and Fees dated Feb. 6, 2014 for U.S. Appl. No. 13/851,926.
Notice of Allowance and Fees dated Sep. 4, 2014 for U.S. Appl. No. 13/857,136.
Notice of Allowance and Fees Due dated Jan. 22, 2013 for U.S. Appl. No. 13/270,339.
Notice of Allowance dated Mar. 18, 2013 for U.S. Appl. No. 13/270,335.
Office Action Dated Dec. 13, 2012 for U.S. Appl. No. 13/270,335.
Office Action dated Dec. 10, 2012 for U.S. Appl. No. 13/270,339.
Office Action dated Dec. 31, 2014 for U.S. Appl. No. 13/860,371.
Office Action dated Feb. 17, 2012 for U.S. Appl. No. 13/270,339.
Office Action dated Jan. 30, 2014 for U.S. Appl. No. 13/857,136.
Office Action dated Jan. 8, 2015 for U.S. Appl. No. 14/272,261.
Office Action dated Jun. 29, 2012 for U.S. Appl. No. 13/270,339.
Office Action dated Oct. 25, 2012 for U.S. Appl. No. 13/270,339.
Office Action dated Sep. 4, 2014 for U.S. Appl. No. 13/857,136.
Qin et al., A study of nickel silicide film as a mechanical material, Sensors and Actuators A: Physical, vol. 87, Issues 1-2 Dec. 1, 2000, pp. 95-95.
Yang; Read-Preferred SRAM Cell with Write Assist Circuit Using Back-Gate ETSOI Transistors in 22-nm Technology; IEEE Transactions on Electron Devices, Oct. 2012, vol. 99, No. 10, pp. 2575-2581.
Nenadovic et al., RF Power Silicon-On-Glass VDMOSFETs, IEEE Electron Device Letters, vol. 25, No. 6, Jun. 2004, pp. 424-426.
Office Action dated Aug. 12, 2015 for U.S. Appl. No. 14/272,261.

(56) References Cited

OTHER PUBLICATIONS

Office Action dated Jun. 30, 2015 for Chinese Patent Application No. 201180059579.3.
Supplementary Partial European Search Report dated Jul. 31, 2015 for European Patent Application No. EP 11833222.
Office Action dated Jan. 16, 2015 for U.S. Appl. No. 14/451,342.
International Search Report and Written Opinion—PCT/US2016/012071—ISA/EPO—Mar. 10, 2016.
Baine P., et al., "Manufacturing Processes for WSi2-GPSOI Substrates and their Influence on Cross-Talk Suppression and Inductance," Semiconductor Wafer Bonding VII: Science, Technology, and Applications, Proceedings of the International Symposium, Electrochemical Society Proceedings vol. 2003-19, pp. 57-63.

* cited by examiner

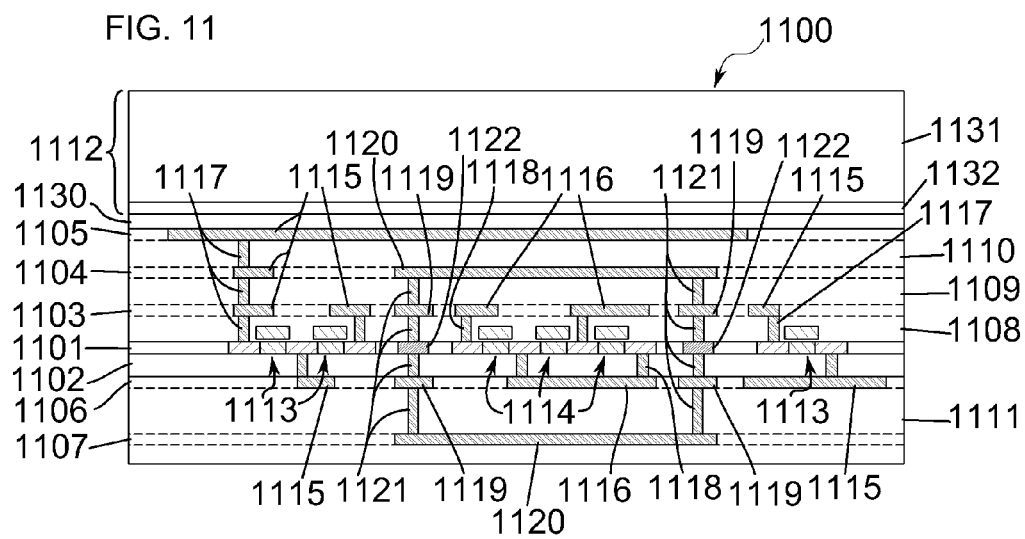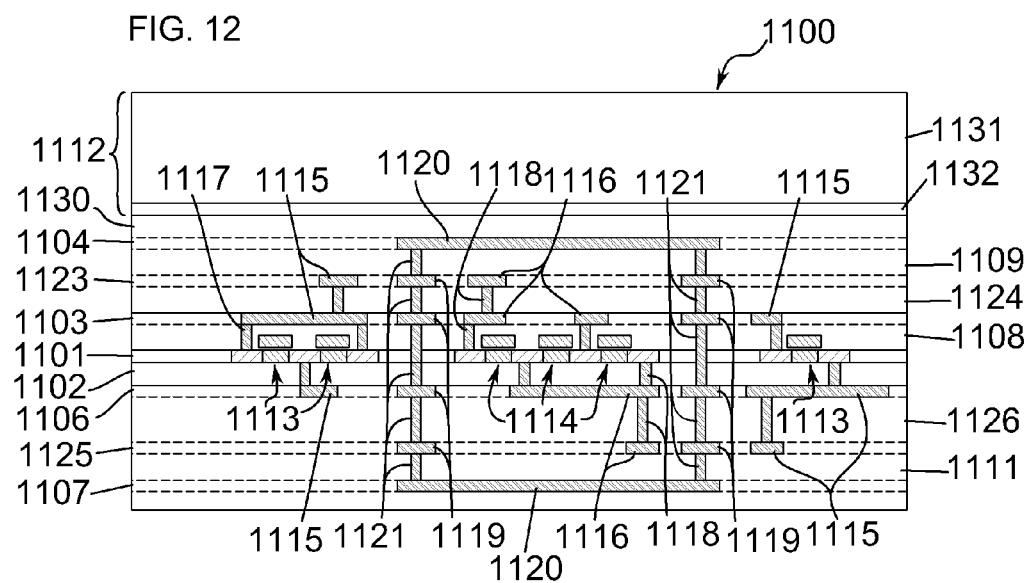

INTEGRATED CIRCUIT ASSEMBLY WITH FARADAY CAGE

CROSS-REFERENCE TO RELATED APPLICATIONS

This application is a continuation-in-part of U.S. application Ser. No. 14/272,261, filed May 7, 2014, which is a continuation of U.S. patent application Ser. No. 13/851,926, now U.S. Pat. No. 8,748,245, filed Mar. 27, 2013, all of which are hereby incorporated by reference herein in their entirety for all purposes. This application also relates to the disclosure in U.S. application Ser. No. 14/451,342, filed Aug. 4, 2014, which is hereby incorporated by reference herein in its entirety for all purposes.

BACKGROUND OF THE INVENTION

In an integrated circuit, metal lines typically connect individual circuit elements together. The nature of this metal interconnect critically affects the performance and cost of the integrated circuit product. For example, most integrated circuit processes offer multiple levels of metal interconnect, in order to allow the maximum flexibility in circuit layout. This layout flexibility allows a designer to minimize the size of an integrated circuit, for example, reducing the cost of the product.

An example of a typical circuit layout with two levels of metal interconnect is shown in FIG. 1. This layout includes two metal-oxide-semiconductor field effect transistors (MOSFET) 240. Isolation edges 235 and gate fingers 240$g$ define the transistors. One of the transistors 240 has two gate fingers 240$g$ and one has three gate fingers. The gate shapes 240$g$ and isolation edges 235 determine the source and drain regions of the transistors (240$s$ and 240$d$, respectively). The drains 240$d$ of both transistors 240 are electrically connected together, through contacts 245, first metal lines 250, inter-metal vias 270, and second metal line 280. The source regions 240$s$ of the two transistors are connected individually through contacts 245 and first metal lines 250. The layout of FIG. 1 could be, for example, a complementary metal-oxide-semiconductor (CMOS) inverter, if one of the transistors 240 is an n-channel MOSFET and the other is a p-channel MOSFET.

In most multi-level metallization schemes, to connect upper-level metal lines to lower level metal lines or transistor electrodes (sources, drains, and gates), all of the intermediate metal layers and contacts or vias must be used. This can be seen in FIG. 1, where the second level metal line 280 is connected to transistor drains 240$d$ through the first metal layer 250 and metal/diffusion contact 245. Thus, to connect source fingers 240$s$ together, for example, a metal line 250 runs outside the transistor area to avoid shorting transistor sources 240$s$ and drains 240$d$ together. This increases the height, and thus the area, of the layout. Moreover, the width of this layout is determined by the minimum pitch of the contacted first metal lines, or the minimum pitch of the contacted source/drain regions—whichever is greater. If the minimum pitch of the contacted first metal lines is the greater of the two pitches, then this layout may be reduced in width by an alternative metallization scheme. Note that the minimum pitch of the contacted metal lines may be determined by lithographic or other process considerations, or it may be determined by electromigration concerns or other considerations/concerns.

The resistance (per unit length) and capacitance (per unit area) of the metal interconnect layers often has a direct impact on the performance of an integrated circuit. The interconnect structures and materials used affect, in turn, the resistance and capacitance of the interconnect lines. For example, the capacitance between a given interconnect line and the semiconductor substrate, or the capacitance between two interconnect lines, decreases as the vertical distance between them increases. If multiple interconnect layers are available, critical capacitances can be reduced by placing their nodes on metal layers that have more vertical separation between them.

To illustrate the origin of these parasitic capacitances, a cross-section of the layout of FIG. 1 is shown in FIG. 2. Parasitic capacitances, for example, between the gates 240$g$ and the drain regions 240$d$ (gate-drain capacitance) and the source 240$s$ and drain 240$d$ regions (off-state capacitance), are determined partly by the interconnect structure. For example, the overlap area between the first metal lines 250 and the source regions 240$s$ forms a component of the off-state parasitic capacitance 290. The capacitance between the contact metal 245 and the transistor gates 240$g$ contributes to the total gate-drain parasitic capacitance. Thus, the metallization scheme and layout has an effect on circuit parasitic capacitances, and therefore circuit performance.

These parasitic effects are important for high frequency and high-speed circuits. Such circuits are often implemented on semiconductor-on-insulator (SOI) technology, which was first commercialized in the late 1990s. The defining characteristic of SOI technology is that the semiconductor region in which circuitry is formed is isolated from bulk substrate by an electrically insulating layer. This insulating layer is typically silicon dioxide. The advantageous aspects of SOI technology stem directly from the ability of the insulator layer to electronically isolate the active layer from bulk substrate.

SOI technology represents an improvement over traditional bulk substrate technology because the introduction of the insulating layer isolates the active devices in an SOI structure, which improves their electrical characteristics. For example, parasitic capacitances within the semiconductor region—depletion and diffusion capacitances, for example—are often reduced in SOI devices, especially those with thin enough semiconductor layers such that the transistors are "fully-depleted." Short-channel effects—the variation of the threshold voltage of a transistor with its channel length—are also reduced in SOI devices. For these reasons, among others, SOI is often the technology of choice for high-speed, low-power circuits. In addition, the SOI's insulating layer can act to shield the active devices from harmful radiation. This is particularly important for integrated circuits that are used in space given the prevalence of harmful ionizing radiation outside the earth's atmosphere.

Like bulk-substrate technologies, SOI technologies may also make use of multiple layers of metal interconnect. If these metal layers can be formed in such a way as to take advantage of the unique structure of SOI, cost and performance benefits can result. These performance benefits may be especially desirable for the types of circuits typically fabricated on SOI technologies—high-speed or high switching frequency, low-loss circuits.

SUMMARY OF THE INVENTION

In accordance with some embodiments, an integrated circuit assembly is formed with an insulating layer, a semiconductor layer, an active device, first, second, and third electrically conductive interconnect layers, and a plurality of electrically conductive vias. The insulating layer has a first surface and a second surface. The second surface is below the first surface. A substrate layer has been removed from the second surface. The semiconductor layer has a first surface and a second surface. The first surface of the semiconductor layer contacts the first surface of the insulating layer. The active device is formed in a region of the semiconductor layer. The first electrically conductive interconnect layer forms an electrically conductive ring. The second electrically conductive interconnect layer forms a first electrically conductive plate above the electrically conductive ring and the region of the semiconductor layer. The third electrically conductive interconnect layer forms a second electrically conductive plate below the electrically conductive ring and the region of the semiconductor layer. The plurality of electrically conductive vias electrically couple the electrically conductive ring to the first electrically conductive plate and to the second electrically conductive plate. The electrically conductive ring, the first electrically conductive plate, the second electrically conductive plate, and the plurality of electrically conductive vias form a Faraday cage around the active device.

In some embodiments, the electrically conductive ring is above the region of the semiconductor layer in which the active device is formed. In other embodiments, the electrically conductive ring is below this region of the semiconductor layer. In some embodiments, one or more additional electrically conductive rings are formed above or below this region. Each electrically conductive ring may have an opening through which an electrically conductive connection line may electrically connect the active device within the Faraday cage to one or more other active devices outside the Faraday cage. Additionally, in some embodiments, the first and second electrically conductive plates are perforated with holes that reduce a capacitance to ground of the active device within the Faraday cage. Furthermore, in some embodiments, a handle wafer having a substrate may be bonded above the electrically conductive interconnect layers, so that all of the electrically conductive interconnect layers are on one side of the overall structure.

BRIEF DESCRIPTION OF THE DRAWINGS

FIG. 11 is a simplified cross section of a portion of an integrated circuit assembly with a Faraday cage in accordance with an embodiment.

FIG. 12 is a simplified cross section of a portion of another integrated circuit assembly with a Faraday cage in accordance with an alternative embodiment.

DETAILED DESCRIPTION OF THE EMBODIMENTS

High-speed, high performance integrated circuits are often fabricated using silicon-on-insulator (SOI) technologies. SOI technologies also lend themselves to layer-transfer techniques, where the active layer of the SOI is transferred, using bonding and etch-back methods, to a different substrate. This method may have advantages of lower capacitance and higher speed, easier thermal management, and easier access to the body regions of SOI transistors. An example of such a process is described in U.S. Pat. No. 8,357,935 entitled, "Silicon-on-insulator with back side connection", owned by the assignee of the present application and filed on Apr. 28, 2012, which is incorporated herein by reference in its entirety. Layer transfer techniques may also be used to form circuits on fully insulating or transparent substrates, which may be advantageous in opto-electronic applications, for example.

Transferring the active layer of an integrated circuit also can expose the surface of the insulator layer (opposite the active devices) to further processing, if desired. In particular, a full interconnect layer can be formed on this insulator layer surface after the substrate is removed. An interconnect layer so placed may contact the transistor source and drain regions through holes etched in the SOI's insulating layer. This arrangement offers added layout flexibility. Also, this back side interconnect layer provides lower parasitic capacitance when compared to traditional, front-side interconnect layers. Lastly, such an interconnect layer aids in dissipating heat generated by the SOI integrated circuit. The problems with heat dissipation on SOI circuits, and some proposed solutions, are described in U.S. Patent Publication No. 2011/0012199 entitled, "Semiconductor-on-insulator with back-side heat dissipation," owned by the assignee of the present application and filed on Jul. 14, 2010, which is incorporated herein by reference in its entirety.

In one embodiment, a full back side SOI interconnect layer connects a plurality of active or reactive devices together, providing a lower cost alternative for providing high performance SOI integrated circuits. Various embodiments include: reducing contact resistance to the back side of the active layer by forming heavily-doped regions through the back side contacts, or etching through the active layer to contact heavily doped or silicided areas on the front surface of the active layer. If the transferred structure can withstand higher temperatures, more process flexibility is possible.

Figure 3:
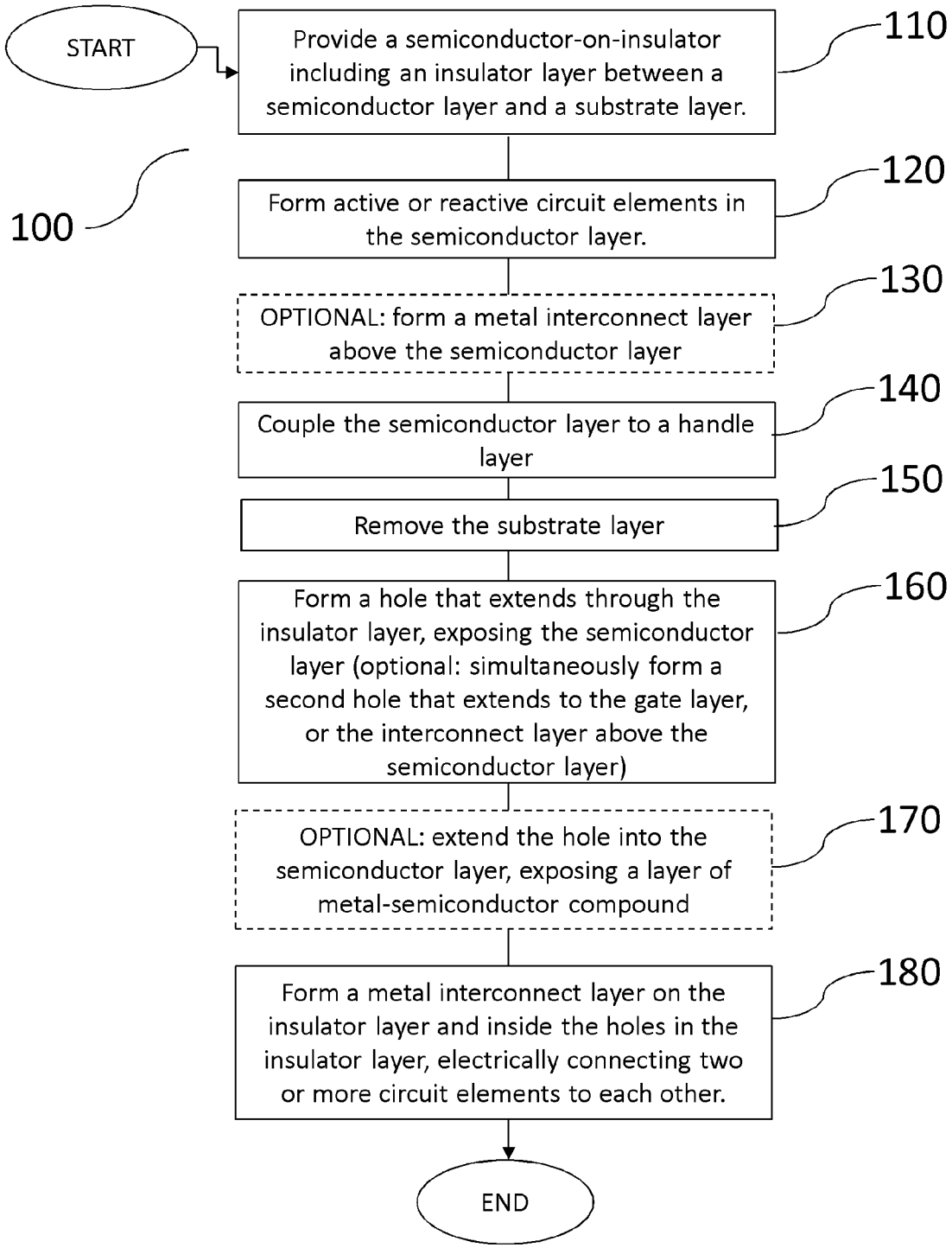
FIG. 3 shows a process flow chart of a method of fabricating an integrated circuit with metal interconnects on the back side of an SOI insulator that is in accordance with a specific embodiment of the present invention.

FIG. 3 illustrates some embodiments of methods of the present disclosure, where a metal interconnect layer is formed on the back side of an SOI integrated circuit. In flowchart 100 of FIG. 3, a semiconductor-on-insulator structure is provided in step 110. This structure includes an insulator layer disposed between a semiconductor layer and a substrate layer. The insulator layer may be, for example, silicon dioxide, which may be 15-1000 nm thick. In step 120, active or reactive circuit elements are formed in the semiconductor layer. Such elements may include, for example, n-channel and p-channel MOS (NMOS and PMOS) transistors. The semiconductor layer may be removed in certain areas—for example, in the isolation areas located between active devices—and replaced with dielectric. These elements may be formed using, for example, a standard CMOS process, or a bi-polar-CMOS (BiCMOS) process, or a process that forms high-power devices or optoelectronic devices in addition to MOS transistors. This process may include forming a metal-semiconductor compound on regions of the semiconductor layer; for example, on the source and drain regions of the MOSFETs. Such a compound would reduce the sheet resistance of these regions. If the semiconductor layer comprises silicon, the metal-semiconductor compound may include, for example, titanium silicide, cobalt silicide, or nickel silicide. In step 130, a metal interconnect layer is optionally formed above the semiconductor layer. This layer may electrically connect to the circuit elements formed in the semiconductor layer. This layer may be formed using a subtractive, or Damascene, process, or it may be formed using an additive process. This layer may be comprised, for example, of a refractory metal, for example, tungsten.

In step 140 of FIG. 3, a handle layer is coupled to the semiconductor layer of the SOI structure. The handle layer could be any rigid or semi-rigid support, for example, a silicon wafer. Any suitable coupling or bonding method that results in a permanent bond may be used; for example direct or fusion bonding, permanent adhesive bonding, metallic interdiffusion or eutectic bonding. If a front-side interconnect layer is used (step 130), it may be advantageous for bonding purposes to use a Damascene process to form this layer, since a planar surface will result. A bonding layer, for example, silicon dioxide, may be deposited on the SOI structure, or the handle layer, or both. This layer may be deposited using, for example, chemical vapor deposition (CVD). In step 150, the substrate layer of the SOI is removed. This could be done by using, for example, mechanical and chemical means independently or in combination.

Still referring to FIG. 3, in step 160, a hole is etched in the exposed surface of the insulator layer. This hole extends through the insulator layer, from one surface to the opposite surface. This may be accomplished, for example, by forming the hole pattern in a photoresist using photolithography, and etching the insulator layer in an RIE or plasma etch chamber, or using hydrofluoric acid (HF). After the hole is formed, the semiconductor layer surface is exposed inside the hole. During the etching step 160, another hole that extends to a transistor gate layer, or to the (optional) interconnect layer formed in step 130, may be formed. Such a hole could be formed, for example, through the dielectric isolation areas between the active or reactive devices. All of these different types of holes—those extending to the semiconductor layer, a gate layer, or an interconnect layer—are etched through the same material (for example, silicon dioxide). Thus, they can all be etched in the same step 160. In step 170, the hole extending to the semiconductor layer may optionally be extended into the semiconductor. The etching may stop at the metal-semiconductor compound layer, if present. This etching process may be done in a dry-etch chamber, using a chemistry that will etch the semiconductor faster than the metal-semiconductor compound. For example, for a silicon layer with nickel silicide formed on the front surface, an $SF_6+O_2$ etch will etch the silicon but not etch the nickel silicide.

In step 180 of FIG. 3, a metal interconnect layer is formed on the back side of the insulator and inside the hole formed in step 160. This metal interconnect layer could comprise, for example, tungsten plugs, aluminum, copper, or a combination of these. It could be formed by standard patterning techniques; for example, depositing the metal, patterning with a photoresist, and etching the metal. The resulting pattern will connect two or more of the devices formed in the semiconductor layer to each other. If there are holes formed in step 160 that extend to a gate layer or a front-side metal interconnect layer (if step 130 is performed), then an electrical connection can be formed between the back side metal formed in step 180 and a gate or front side metal layer.

Figure 4A:
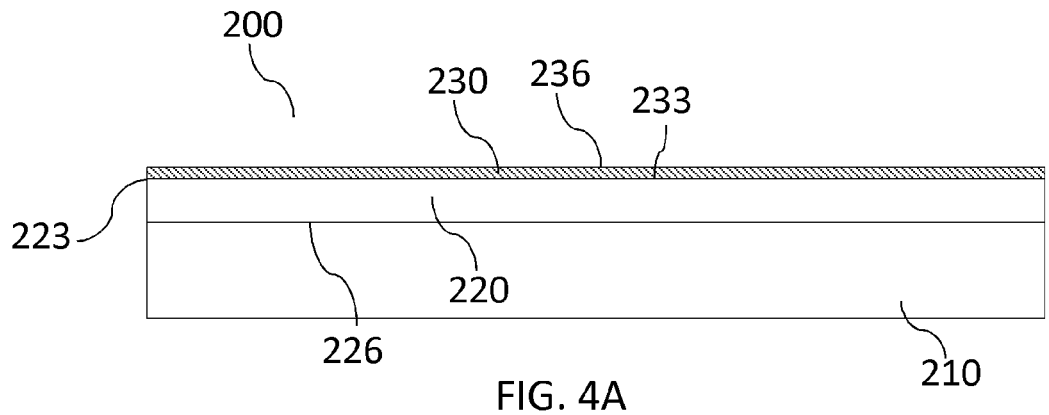
FIGS. 4A-G show cross-sectional views of stages of forming interconnect on the back side of an SOI circuit, according to some embodiments.

FIGS. 4A-G illustrate an exemplary back side SOI structure fabricated according to the method of FIG. 3. In FIG. 4A, an SOI structure 200, having a substrate layer 210, an insulating layer 220, and a semiconductor layer 230, is provided. The insulating layer 220 has a first surface 223 (in contact with the semiconductor layer 230) and a second surface 226 in contact with the substrate 210. The semiconductor layer 230 has a first surface 233 (in contact with the first surface 223 of the insulating layer 220) and a second surface 236. The insulating layer may be comprised of, for example, silicon dioxide, and it may be, for example, between 10 and 1000 nm thick, for example, between 15 and 70 nm thick, or between 150 and 350 nm thick, or between 500 and 750 nm thick. The semiconductor layer may be comprised of, for example, silicon, or a III-V semiconductor such as GaAs, or a strained semiconductor alloy such as SiGe.

Figure 4B:
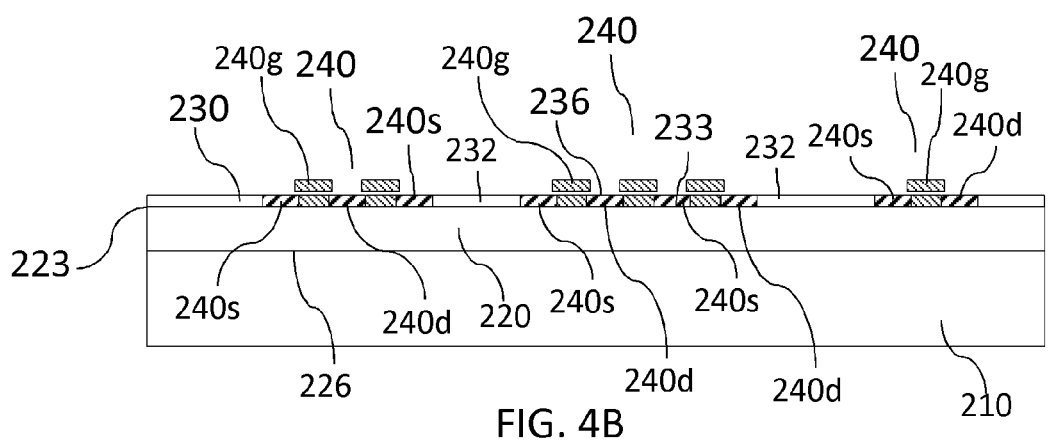

In FIG. 4B, circuit elements, for example, transistors 240, are formed in the semiconductor layer. These transistors 240 comprise source 240s and drain 240d regions, and gate layers 240g, and are separated by isolation regions 232. These elements may be formed as described for step 120 in FIG. 3 above; that is, using, for example, a standard CMOS process, or a bi-polar-CMOS (BiCMOS) process. Other circuit elements may be formed in addition to, or instead of, CMOS transistors 240, for example, high-power devices, optoelectronic devices, or other passive or reactive elements.

The source 240s and drain 240d regions in FIG. 4B comprise areas of the semiconductor layer that are heavily doped, in comparison, for example, to the transistor channel regions underneath the gates 240g. The high doping level is important, for example, to allow good electrical contact to these regions. If the semiconductor layer is thin enough—for example, less than 100 nm, or less than 70 nm, or less than 50 nm—the source and drain heavily-doped regions may extend through the full thickness of the semiconductor layer, as shown in FIG. 4B. Note also that the source 240s and drain 240d regions of transistors 240 may be raised above the surface 236 of the semiconductor layer 230. Such a structure is often used for fully-depleted SOI processes, which are built on very thin semiconductor layers, for example, less than 20 nm, or less than 10 nm, or between 5 and 7 nm.

Figure 4C:
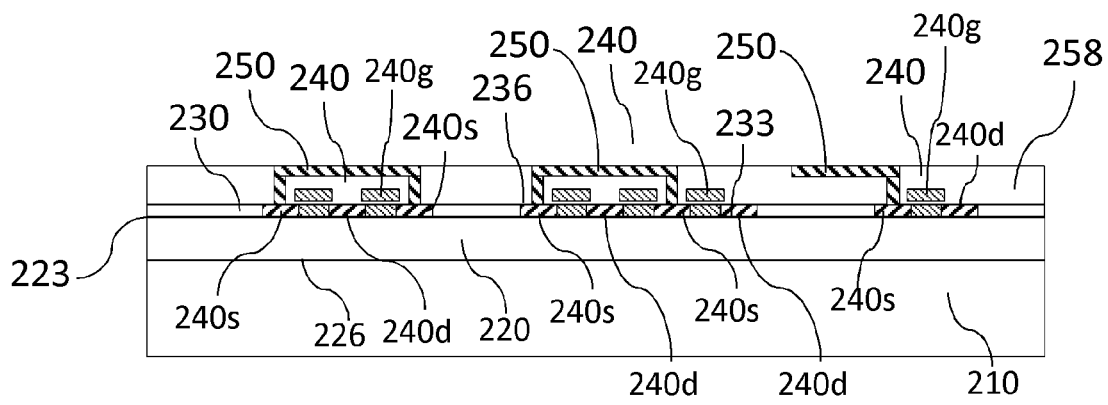
Figure 4D:
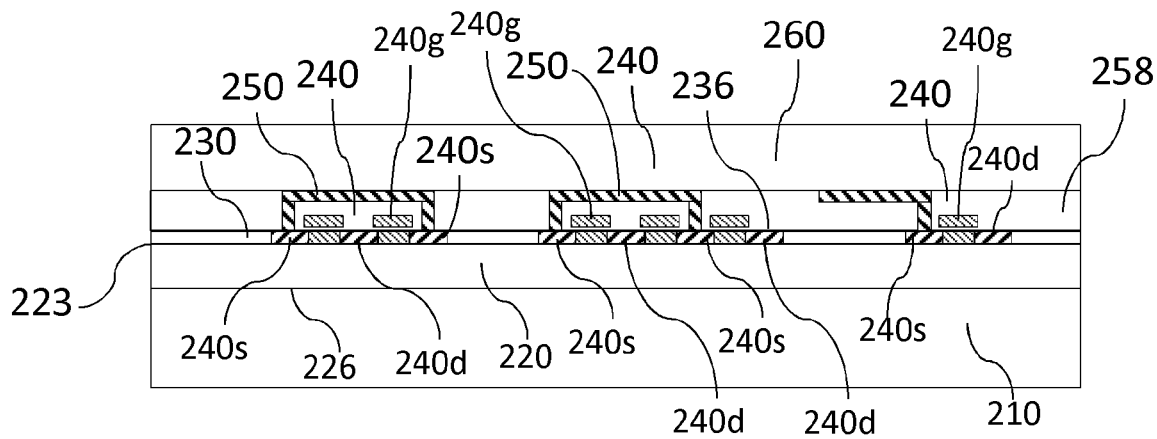

FIG. 4C shows a front metal interconnect layer 250 optionally coupled to the second surface 236 of the semiconductor layer 230, and above the circuit elements (transistors 240) fabricated therein. If present, this interconnect layer 250 may connect, for example, to the source regions 240s of the transistors 240. A subtractive, or Damascene, process may be used to form optional interconnect layer 250. Interconnect layer 250 may comprise a high-temperature capable interconnect, for example, a refractory metal, for example, tungsten. Alternatively, interconnect layer 250 may comprise a conventional low-resistivity material, for example, copper or aluminum, or it may comprise a combination of high-temperature-capable interconnect and low-resistivity material, for example tungsten plugs with aluminum or copper metal. An inter-level dielectric layer 258 separates the optional front metal interconnect layer 250 from the devices 240 formed in the semiconductor layer 230. In FIG. 4D, a handle layer 260 is coupled to the surface 236 of the semiconductor layer 230, with inter-level dielectric layer 258 and front interconnect layer 250, if present, intervening. As shown in FIG. 4D, handle layer 260 is bonded above interconnect layer 250, if present. As described in step 140 of FIG. 3, the handle layer could be any rigid or semi-rigid support, for example, a silicon wafer, and any suitable coupling or bonding method that results in a permanent bond may be used; for example direct or fusion bonding, or permanent adhesive bonding. A bonding layer (not shown), for example, deposited silicon dioxide, may be formed on the either, or both, of the bonded surfaces.

Figure 4E:
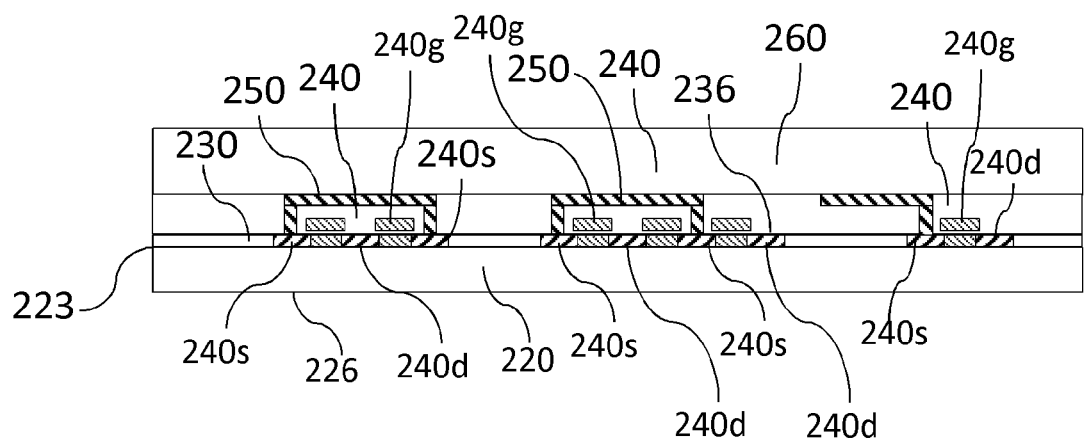
Figure 4F:
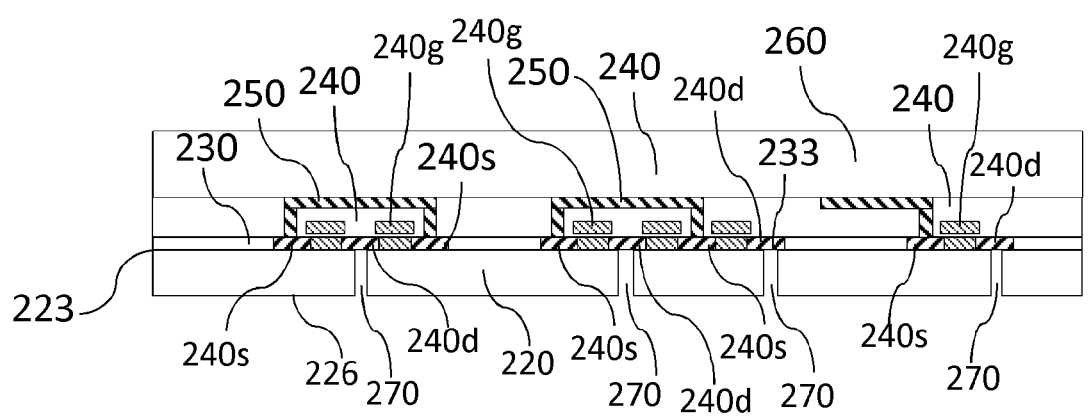

In FIG. 4E, the substrate 210 of the SOI structure has been removed, by using, for example, mechanical and chemical means independently or in combination. This step exposes the surface 226 of the insulator layer 220. In FIG. 4F, holes 270 have been etched through the insulator layer 220, exposing regions of the surface 233 of the semiconductor layer 230. These holes can be formed by any standard patterning technique as described above for step 160 in FIG. 3, for example, photolithographic patterning of a resist layer followed by dry etching of the insulator layer 220. These holes may expose, for example, the drain regions 240d of transistors 240. Holes could also expose, for example, source or body regions of CMOS transistors, or collector regions of vertical bipolar transistors, or collector, base, or emitter regions of lateral bipolar transistors.

Figure 4G:
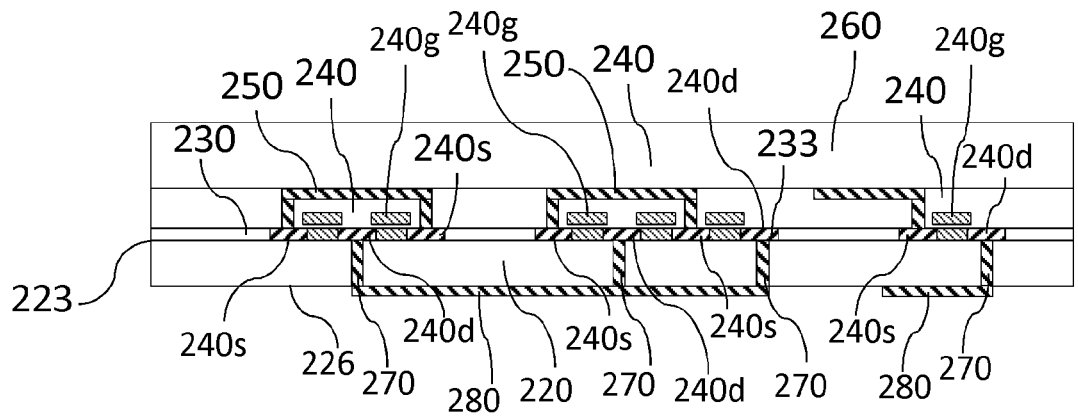

Turning to FIG. 4G, a back side metal interconnect layer 280 is formed on the surface 226 of insulator layer 220 and inside the holes 270. As described in step 170 of FIG. 3, this metal interconnect layer could comprise, for example, aluminum, copper, tungsten, or a combination of these. It could be formed by standard patterning techniques; for example, an additive process, or a subtractive process. The back side metal layer 280 may connect two or more transistors 240 to each other. For example, as shown in FIG. 4G, back side metal layer 280 may connect some of the drains 240d of transistors 240 together.

Figure 5:
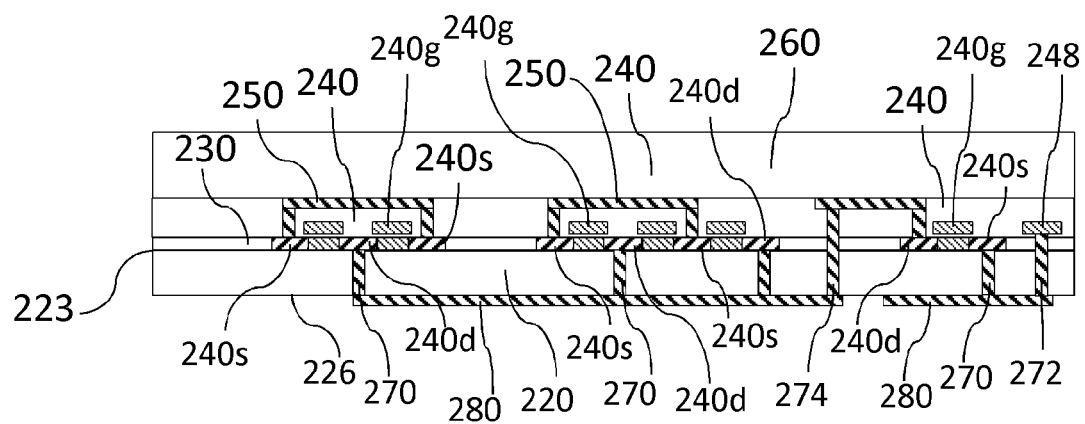
FIG. 5 shows a cross-sectional view of another embodiment, wherein multiple types of back contacts are formed.

FIG. 5 shows an alternative structure that may be formed using the process according to the method of FIG. 3. In FIG. 5, other holes 272 and 274 are formed, in addition to holes 270. Both holes 272 and 274 are formed over isolation regions between transistors 240. Hole 272 extends to a gate region 248 that extends over the isolation region, and hole 274 extends to the optional front metal interconnect layer 250. Holes 272 and 274 may be formed simultaneously with holes 270; that is, in the same masking step. Alternatively, separate masking steps may be used for the different types of contact holes, for example, if it is desired that the overetch of the semiconductor layer inside holes 270 be minimized. In this structure, the back side interconnect is electrically connected to the optional front side interconnect, or the transistor gate layer, or both. This can allow greater layout flexibility and thus cost savings.

Figure 6:
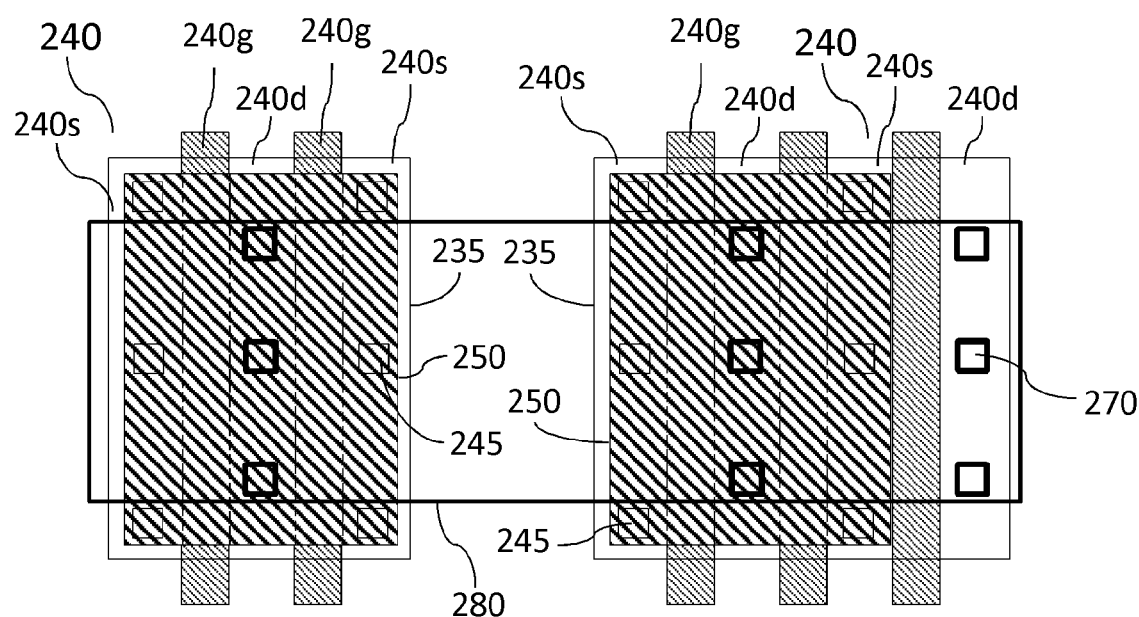
FIG. 6 shows a layout of an SOI integrated circuit using back side interconnect that is in accordance with a specific embodiment of the present invention.

FIG. 6 shows an example layout that utilizes the area-saving features of this invention. As in FIG. 2, gate fingers 240g and isolation edges 235 define transistors 240. Transistors 240 further comprise drain regions 240d and source regions 240s. A front side metal interconnect layer 250 connects the source regions 240s together through contacts 245. Note that there is no connection between interconnect layer 250 and the drain regions 240d; therefore, the metal layer 250 connecting the source regions 240s can be drawn overlapping the drain regions 240d without going outside of the transistor area. Drain regions 240d are connected through back side holes (or vias) 270 to back side interconnect layer 280. In this way, the area of this integrated circuit can be reduced compared to the prior art shown in FIG. 2.

Figure 7A:
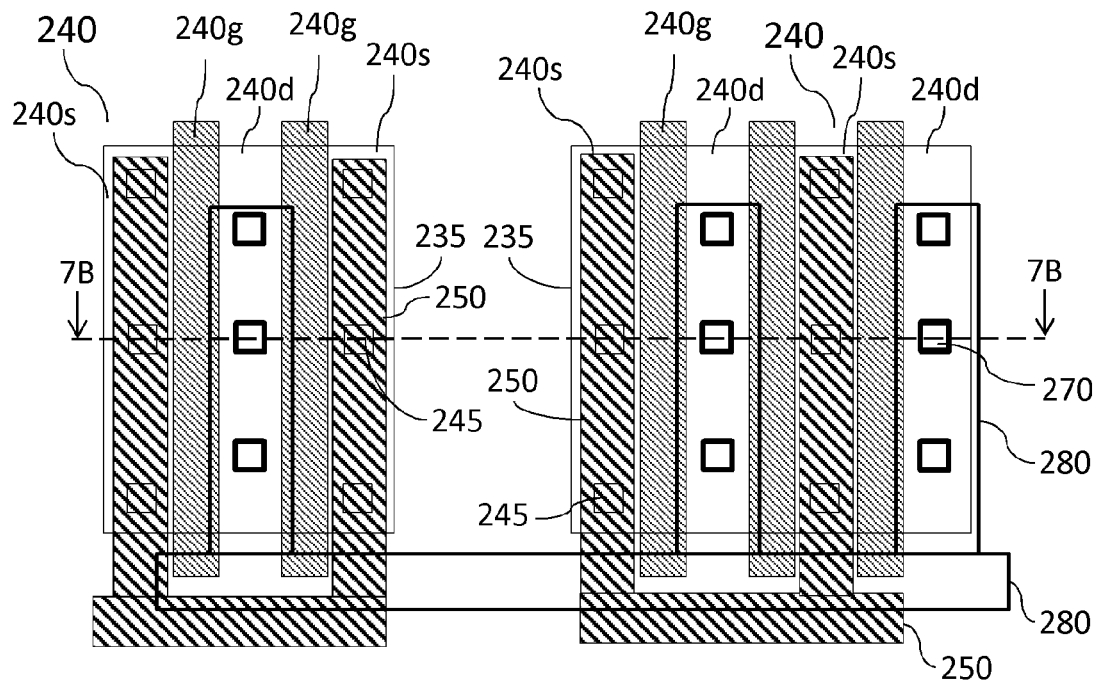
FIGS. 7A-B show an alternative layout and cross section of an SOI integrated circuit using back side interconnect that is in accordance with a specific embodiment of the present invention.
Figure 7B:
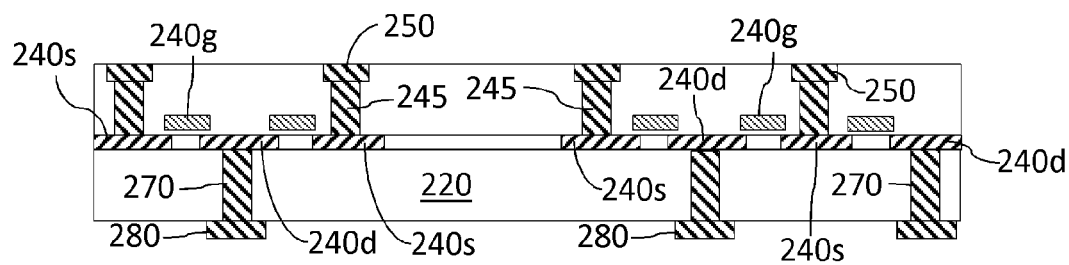

FIG. 7A shows an example layout for the reduction of parasitic capacitance. Again, gate fingers 240g and isolation edges 235 define the source 240s and drain 240d regions of transistors 240. Front side metal 250 is again connected to the source regions 240s through contacts 245. Back side metal 280 is connected to drain regions 240d through back side vias 270. So as to reduce gate-to-source (off-state) capacitance, the source metal 250 is not drawn overlapping the drain regions 240d, and the back side drain metal 280 is not drawn overlapping the source regions 240s. Thus, the interconnect contribution to the parasitic off-state capacitance is limited to the area of overlap of the back side metal 280 and front side metal 250 layers. However, this capacitance is much reduced compared to the case of FIG. 2, since the two layers are more separated vertically. FIG. 7B shows a cross sectional view of the layout illustrated in FIG. 7A. This figure clearly shows how the front side source metal 250 and the back side drain metal 280 are separated from each other as far as they can be.

Figure 8:
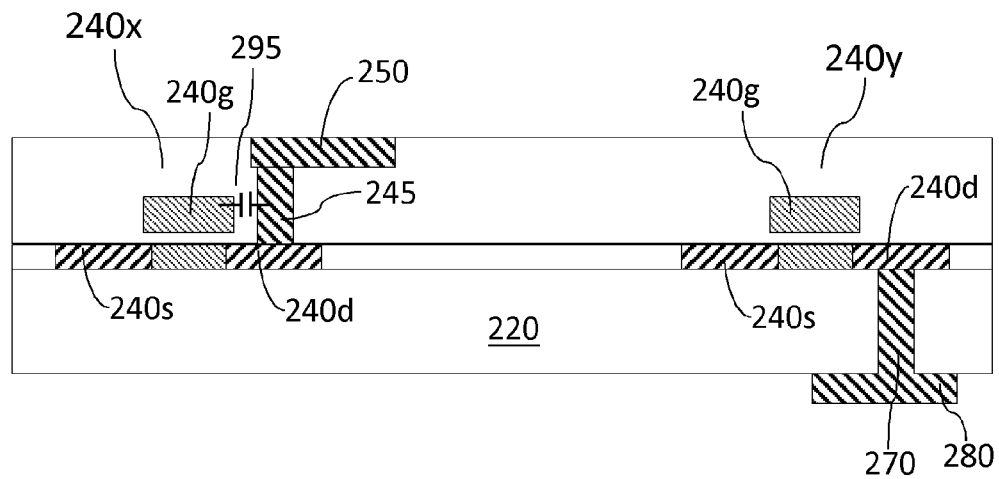
FIG. 8 shows a cross-sectional view of transistors formed using an embodiment of the current invention, illustrating differences in parasitic capacitances.

Using this embodiment, where the back side metal 280 connects to drain regions 240d, the gate-to-drain capacitance is also reduced. FIG. 8 shows a cross section of two transistors 240x and 240y fabricated using an embodiment of the current invention. Transistor 240x has its drain 240d contacted from the front, and transistor 240y has its drain 240d contacted from the back. The gate-drain capacitance for transistor 240x includes as a component the capacitance 295 between the front contact 245 and the gate 240g. However, for the back-contacted transistor 240y, there is no such capacitance adding to the total gate-drain capacitance. Thus, the total gate-drain capacitance is reduced for transistors with back-contacted drains.

Figure 1:
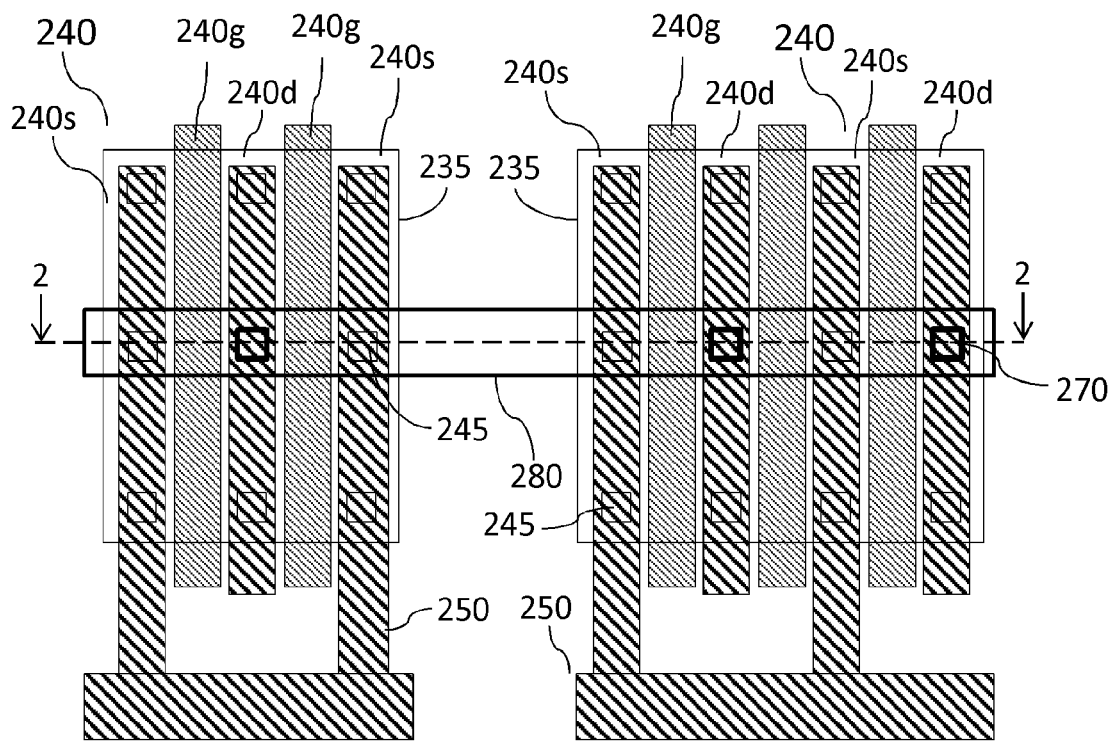
FIG. 1 illustrates a typical integrated circuit layout with two layers of metal.
Figure 2:
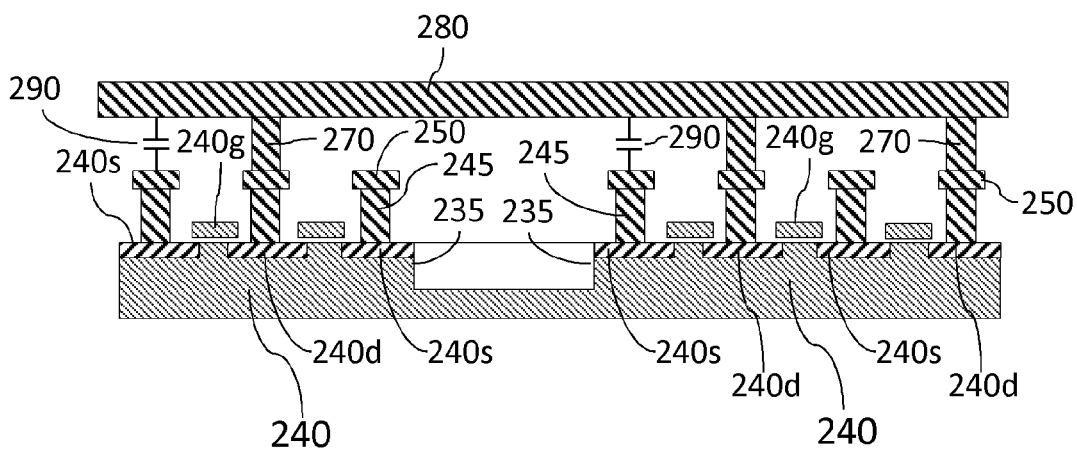
FIG. 2 illustrates a cross-section of the circuit layout shown in FIG. 1.

Note also that, in the transistor layouts (FIG. 6 and FIG. 7), the transistors 240 may be more compacted in the direction perpendicular to the gate fingers 240g, compared to layouts using standard processes (e.g., FIG. 2). This is the case if the minimum front-side contacted metal pitch is greater than the minimum contacted transistor source/drain pitch, which would make the layout of FIG. 2 metal-pitch limited. As shown in FIGS. 6 and 7, the number of front side metal pitches needed to contact the sources and drains of the transistors 240 is reduced by about a factor of 2.

Figure 9A:
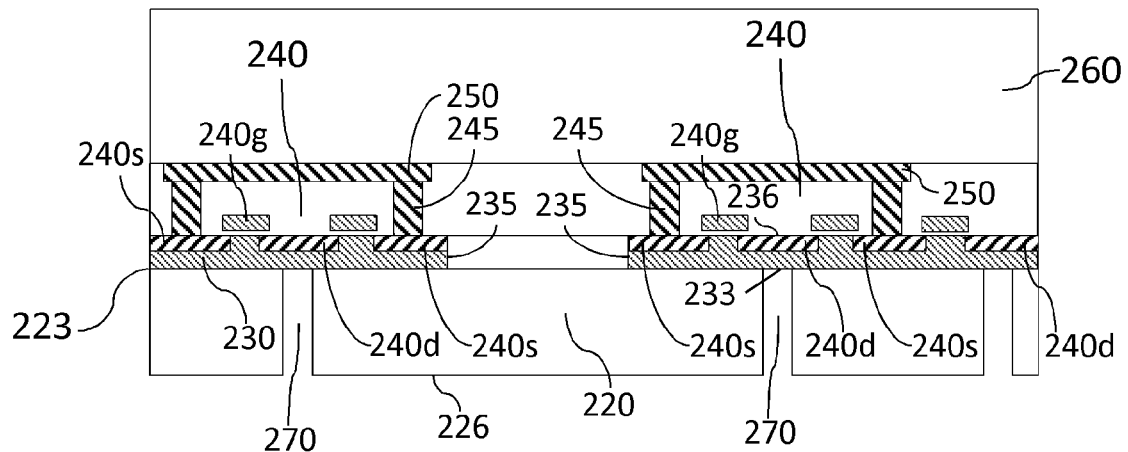
FIGS. 9A-C show cross-sectional views of stages of forming back side diffusions and interconnect, according to some embodiments.
Figure 9B:
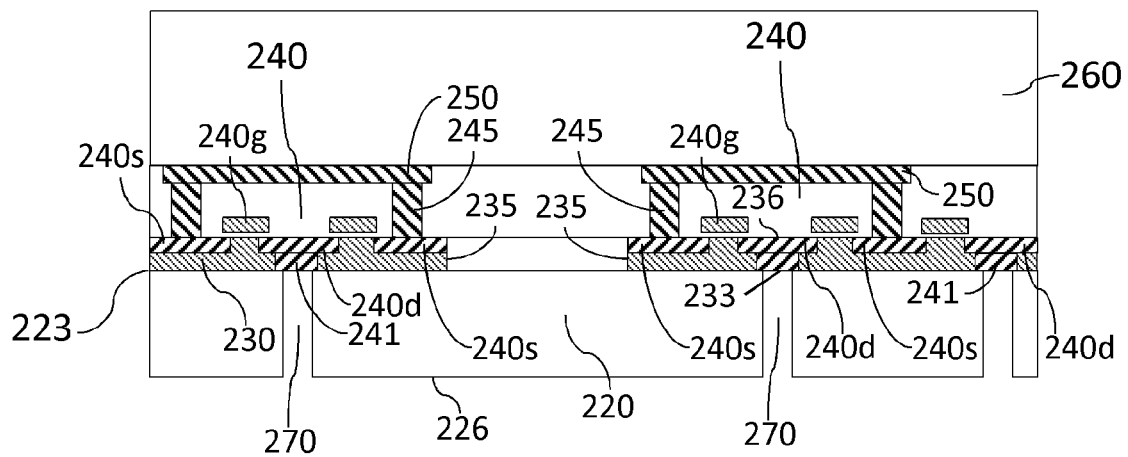
Figure 9C:
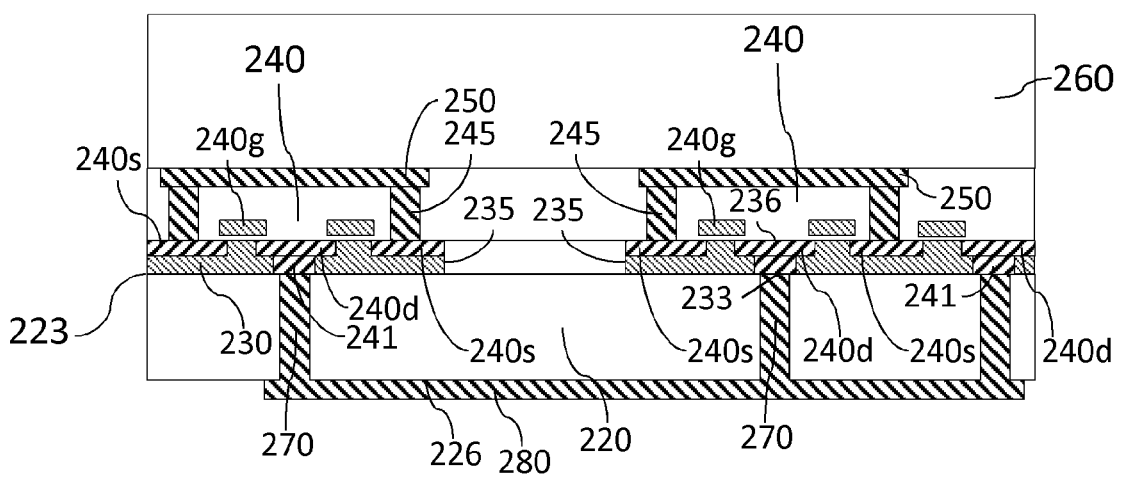

FIGS. 9A-C illustrate an alternative embodiment of an SOI back side metal interconnect. FIG. 9A shows an SOI integrated circuit, with transistors 240 and front-side interconnect layer 250, bonded to handle layer 260. Heavily doped source regions 240s and drain regions 240d do not extend through to the back surface 233 of semiconductor layer 230. Holes 270 have been etched in insulator layer 220 to expose surface 233 of semiconductor layer 230. In FIG. 9B, dopant has been introduced inside holes 270 to form doped regions 241, of the same dopant type as drain regions 240d. Regions 241 effectively extend drain regions 240d to the back surface 233 of semiconductor layer 230, and allow the drain regions 240d to be contacted through back side holes 270. Doped regions 241 may be formed by, for example, implanting dopant ions through holes 270, as described in U.S. Patent Publication No. 2012/0088339 A1 entitled, "Vertical Semiconductor Device with Thinned Substrate," owned by the assignee of the present application and filed on Oct. 11, 2011, which is incorporated herein by reference in its entirety. Alternatively, doped regions 241 may be formed by exposing the structure to a dopant-species-containing ambient (for example, $POCl_3$) at a high temperature (for example, greater than 800° C.). If ion implantation is used, it may be followed by an annealing process to activate the dopant, for example, a rapid thermal anneal at a temperature of 800 to 1000° C. for 1 to 60 seconds. Note that, if a high temperature process is used for this step, it would be advantageous to use a high temperature metal for the front side metal interconnect layer 250, if this layer is used. For example, it would be advantageous if a refractory metal, for example, tungsten, were used for front side metal interconnect 250.

In FIG. 9C, a back side metal interconnect layer 280 is formed on the surface 226 of insulator layer 220 and inside the holes 270, contacting doped region 241 connected to drain regions 240d. This metal interconnect layer could comprise, for example, tungsten, aluminum, copper, or a combination of these. This interconnect layer may, as shown in FIG. 9C connect the drains 240d of transistors 240 together, through back side vias 270 and doped regions 241.

The process described in FIGS. 9A-B provide a means of forming a back-side interconnect contacting drain or source regions, when these regions do not extend to the back side of the semiconductor layer. This may be the case, for example, if the semiconductor layer is greater than 200 nm thick, or greater than 100 nm thick, or greater than 70 nm thick.

Figure 10A:
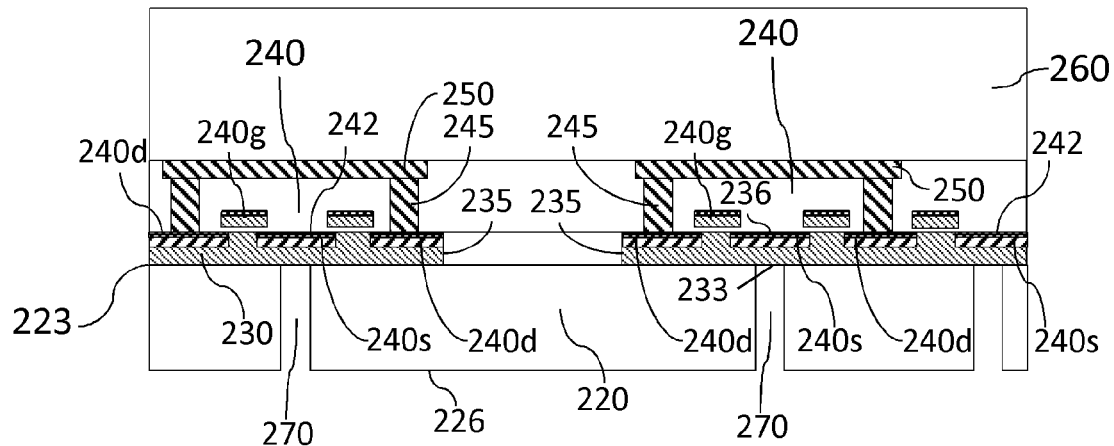
FIGS. 10A-C show cross-sectional views of stages of forming back side contacts and interconnect, according to some embodiments.
Figure 10B:
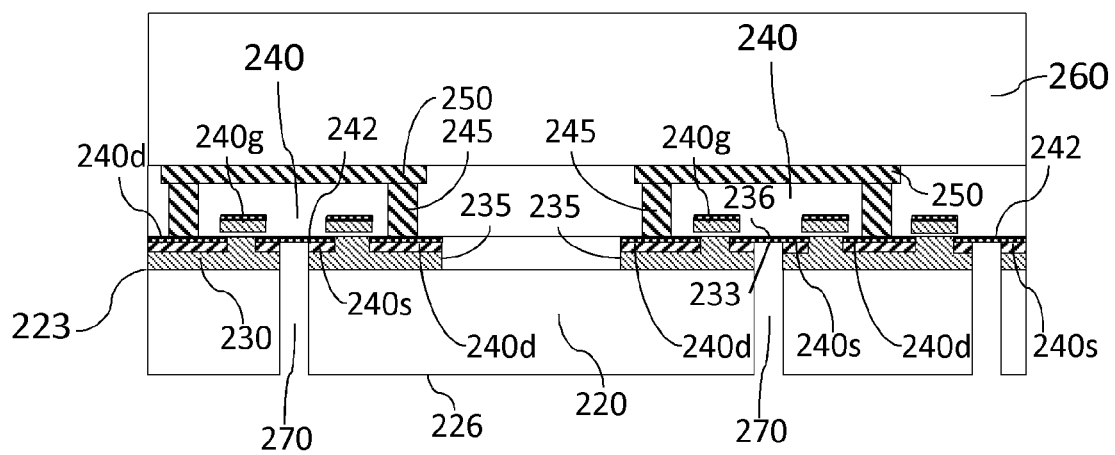
Figure 10C:
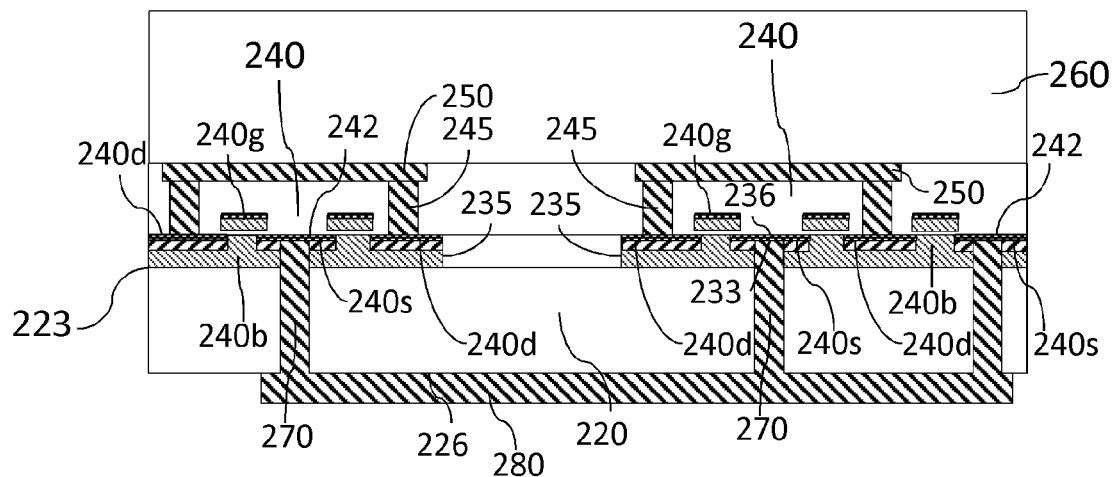

FIGS. 10A-C illustrate another alternative embodiment of an SOI back side metal interconnect. FIG. 10A shows an SOI integrated circuit, with transistors 240 and front-side interconnect layer 250, bonded to handle layer 260. Heavily doped source regions 240s and drain regions 240d do not extend through to the back surface 233 of semiconductor layer 230. Moreover, regions of a metal-semiconductor compound 242 have been formed on the surfaces of the drain regions 240d, source regions 240s, and gate regions 240g of transistors 240. These metal-semiconductor compounds are often used to reduce the sheet resistance and contact resistance of these regions. If the semiconductor layer comprises silicon, the metal-semiconductor compound may comprise, for example, titanium silicide, cobalt silicide, or nickel silicide. These regions are often referred to as "self-aligned silicide", or "SAlicide", regions.

Still referring to FIG. 10A, holes 270 have been etched in insulator layer 220 to expose surface 233 of semiconductor layer 230. In FIG. 10B, the holes 270 have been extended into the semiconductor layer 230 to contact the back side of the metal-semiconductor compound regions 242. This etching process may be done in a dry-etch chamber, using a chemistry that will etch the semiconductor faster than the metal-semiconductor compound. For example, for a silicon layer with nickel silicide formed on the front surface, an $SF_6+O_2$ etch will etch the silicon but not etch the nickel silicide. In FIG. 10C, a back side metal interconnect layer 280 is formed on the surface 226 of insulator layer 220 and inside the holes 270, contacting metal-semiconductor compound regions 242 electrically connected to source regions 240s. This metal interconnect layer could comprise, for example, tungsten, aluminum, copper, or a combination of these.

The structure of FIG. 10C offers several advantages. For example, the transferred semiconductor layer 230 does not need to be exposed to high temperature steps (e.g., to activate dopants), so that low-resistivity, low-temperature metals (e.g., aluminum or copper) may be used for the front-side metal interconnect layer, if present. Also, the hole 270 filled with interconnect metal 280 contacting the metal-semiconductor compound region 242 together provide an excellent thermal path for efficient transfer of heat from active devices 240. Finally, the contact resistance between the metal-filled hole 270 and the metal-semiconductor compound 242 may be advantageously lower than the metal-semiconductor contact resistance between metal-filled holes 270 and the silicon surface 233 (FIG. 4G and FIG. 9C).

In FIG. 10C, the back side interconnect layer 280 is shown connecting transistor sources 240s rather than transistor drains 240d. In this structure as shown, there may be some conduction between the metal filling the hole 270 and the body region 240b of the transistor 240. Thus, in FIG. 10C, the sources and body regions of transistors 240 may be effectively shorted together. For many circuits, especially digital circuits, this is desired. For these types of circuits, then, this structure may offer a layout advantage, since a separate body contact is not necessary.

The process described in FIGS. 10A-C may also be used in combination with the process wherein the diffused regions reach the back side of the semiconductor layer 230 (FIGS. 4A-G). This may be advantageous, for example, in cases a lower drain contact resistance is desired. This structure is also less susceptible to unintended conduction between the metal filling the holes 270 and the body regions of transistors 240, so, for example, analog or other circuits, where source-body ties are not necessarily desired, may be implemented.

Some of the above described processes and structures may be used to form an example integrated circuit (IC) assembly 1100 with a Faraday cage, as shown in FIG. 11, in accordance with an embodiment. The Faraday cage is generally integrated into an IC chip that includes a variety of electronic components and active device structures. The Faraday cage surrounds and electromagnetically isolates one or more of the active device structures that need to be shielded from electromagnetic (E/M) noise or interference generated by other components in the overall IC chip or adjacent thereto.

In some embodiments, the structure and fabrication technique of the Faraday cage enable the components therein to primarily include the active device structures that are to be shielded with minimal additional material or structures enclosed thereby. The size or volume of the Faraday cage is thus generally minimized, thereby also minimizing the exposure of the contained active device structures to external E/M influences.

Additionally, in some embodiments, the structure and fabrication technique of the Faraday cage enable all electrically conductive interconnect layers (e.g. metallization, conductive polysilicon, etc.) to be on one side of a wafer or substrate. With this design, the side of the wafer or substrate that does not have electrically conductive interconnect layers can be removed or thinned near the end of overall processing to make the overall wafer any desired thickness. Also, since one side of the wafer or substrate does not have electrically conductive interconnect layers, handling of the die is simpler or easier, because there is no need to be concerned about scratching any back side metal during wafer and die handling. Furthermore, with no back side metal on the die, there is no concern over shorting any back side metal to the same potential if the die is placed on a package with a metal leadframe. The circuit design, thus, has the flexibility to be used in a variety of different packaging solutions.

The integrated circuit assembly 1100 is shown simplified and idealized in some respects for ease of illustration and description, and the components thereof are not drawn to scale nor intended to represent any particular type of electronic circuitry. The components are shown merely for illustrative and explanatory purposes. In the illustrated embodiment, the integrated circuit assembly 1100 generally includes a semiconductor layer 1101, an insulating layer 1102, electrically conductive interconnect layers 1103-1107, inter-level dielectric layers 1108-1111, and a handle wafer/layer 1112, among other appropriate components not shown for simplicity. A variety of active devices 1113 and 1114, which may be similar to the transistors or active devices described above, are formed in and on various regions of the semiconductor layer 1101 and extend into the first inter-level dielectric layer 1108. The electrically conductive interconnect layers 1103-1107 generally include electrically conductive connection lines 1115 and 1116 separated by the inter-level dielectric layers 1108-1111. Electrically conductive vias 1117 and 1118 electrically connect the electrically conductive connection lines 1115 and 1116 and the active devices 1113 and 1114 through the inter-level dielectric layers 1108-1111 and the insulating layer 1102. The electrically conductive connection lines 1115 and 1116 and the electrically conductive vias 1117 and 1118 electrically connect the active devices 1113 and 1114 to form the electronic circuitry of the integrated circuit assembly 1100.

In addition to the electrically conductive connection lines 1115 and 1116, the electrically conductive interconnect layers 1103-1107 also have electrically conductive connection lines 1119 and 1120 formed therein. The electrically conductive connection lines 1119 and 1120 are electrically connected by electrically conductive vias 1121 formed through the inter-level dielectric layers 1108, 1109, and 1111 and the insulating layer 1102. The electrically conductive connection lines 1119 are shown on the left and right side of the active devices 1114, because these connection lines generally form electrically conductive rings around upper and lower (i.e., sub-insulator) regions of the electrically conductive interconnect layers 1103 and 1106 above and below the region of the active devices 1114. Portions of the rings of the electrically conductive connection lines 1119 are not shown in FIG. 11, however, because they are outside of the plane of the cross section thereof. The electrically conductive connection lines 1120 generally form electrically conductive plates above and below the active devices 1114 and the rings of the electrically conductive connection lines 1119. The rings of the electrically conductive connection lines 1119, the plates of the electrically conductive connection lines 1120, and the electrically conductive vias 1121 generally form the Faraday cage around the active devices 1114. In some embodiments, the Faraday cage is grounded to facilitate the E/M screening.

In some embodiments, an electrically conductive ring of polysilicon 1122 may be formed in the semiconductor layer 1101 along with the active devices 1113 and 1114. The electrically conductive ring of polysilicon 1122, thus, generally surrounds the region of the semiconductor layer 1101 in which the active devices 1114 are formed. Additionally, the electrically conductive vias 1121 also electrically couple the rings of the electrically conductive connection lines 1119 to the electrically conductive ring of polysilicon 1122. In these embodiments, the electrically conductive ring of polysilicon 1122, therefore, also forms part of the Faraday cage.

In some embodiments, one or more additional rings of the electrically conductive connection lines 1119 may be formed between the plates of the electrically conductive connection lines 1120, as shown in FIG. 12. For example, additional electrically conductive interconnect layer 1123 and additional inter-level dielectric layer 1124 have been added between the electrically conductive interconnect layer 1103 and the inter-level dielectric layer 1109 above the region of the active devices 1114. Similarly, additional electrically conductive interconnect layer 1125 and additional inter-level dielectric layer 1126 have been added between the electrically conductive interconnect layer 1106 and the inter-level dielectric layer 1111 below the region of the active devices 1114. Thus, additional rings of the electrically conductive connection lines 1119 may be formed in the additional electrically conductive interconnect layers 1123 and 1125. Furthermore, the electrically conductive vias 1121 form electrical connections through these additional rings. In these embodiments, therefore, the additional rings of the electrically conductive connection lines 1119 and additional electrically conductive vias 1121 also form part of the Faraday cage.

In the embodiments illustrated in FIGS. 11 and 12, either two or four rings of the electrically conductive connection lines 1119 are used. However, any appropriate smaller or larger number of the rings of the electrically conductive connection lines 1119 may be used. In some embodiments, for example, the Faraday cage includes at least one of the rings of the electrically conductive connection lines 1119, while the other rings (including the electrically conductive ring of polysilicon 1122 in FIG. 11) are optional.

The number of the rings of the electrically conductive connection lines 1119 present in any particular embodiment may depend on the need for electrically conductive interconnect lines between the active devices 1114 inside the Faraday cage and the active devices 1113 outside the Faraday cage. Such electrically conductive interconnect lines are generally formed similar to the top/front side interconnect layers and/or bottom/back side interconnect layers described above (e.g., front side interconnect layer 250 and back side interconnect layer 280). Alternatively, polysilicon or other less-conductive layers may also be used for signal propagation into and out of the Faraday cage. This variation may reduce noise propagation into the Faraday cage from signal lines outside the Faraday cage. Also, filters (e.g., RC filters or active filters) may be used to filter noise at specific frequency ranges.

To allow for such interconnects, the rings of the electrically conductive connection lines 1119 include gaps, holes or openings (outside of the planes of the cross sections of FIGS. 11 and 12) through which other electrically conductive interconnect lines (also outside of the plane of the cross section) may be disposed. For example, the simplified layout view in FIG. 13 of a portion of the integrated circuit assembly 1100 shows one of the rings of the electrically conductive connection lines 1119 with an opening 1127 through which an electrically conductive interconnect line 1128 may be disposed, in accordance with some embodiments. The electrically conductive interconnect line 1128 generally connects the electrically conductive connection lines 1116 and the active devices 1114 inside the Faraday cage to the electrically conductive connection lines 1115 and the active devices 1113 outside the Faraday cage.

Each ring of the electrically conductive connection lines 1119 generally has one or more electrically conductive interconnect line (e.g., 1128) and one or more openings (e.g., 1127). The number of electrically conductive interconnect lines (e.g., 1128) and openings (e.g., 1127) is generally dependent on the need for electrical connections between the active devices 1114 inside the Faraday cage and the active devices 1113 outside the Faraday cage and any physical limitations for routing these electrical connections. In some embodiments, the physical limitations for routing these electrical connections may result in some of the rings of the electrically conductive connection lines 1119 not having an opening therein. Instead, the electrically conductive connection lines 1116 at the level of these rings may simply be used to route the electrical connections to a different electrically conductive interconnect layer (e.g., 1103, 1106, 1123 or 1125).

Figure 13:
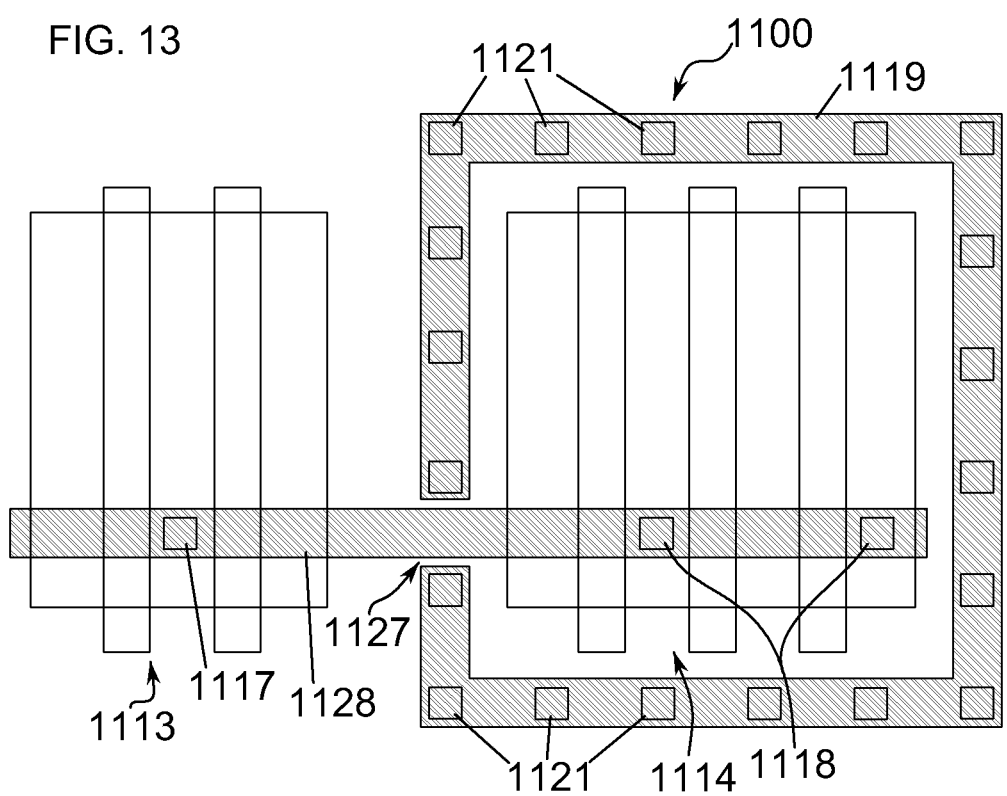
FIG. 13 is a simplified layout view of a portion of the integrated circuit assembly shown in either FIG. 11 or 12 in accordance with an embodiment.

FIG. 13 also shows the electrically conductive vias 1121 arranged at appropriate intervals around the ring of the electrically conductive connection line 1119. The spacing for the electrically conductive vias 1121 and the size of the openings (e.g., 1127) is generally limited by the wavelength of the E/M radiation from electrical signals that the Faraday cage is expected to protect against. For example, for a signal frequency at about 10 GHz or less, the wavelength is on the order of centimeters to millimeters. So a typical spacing of vias of less than 1 micron is sufficiently small enough to screen the E/M radiation due to such signals.

Figure 14:
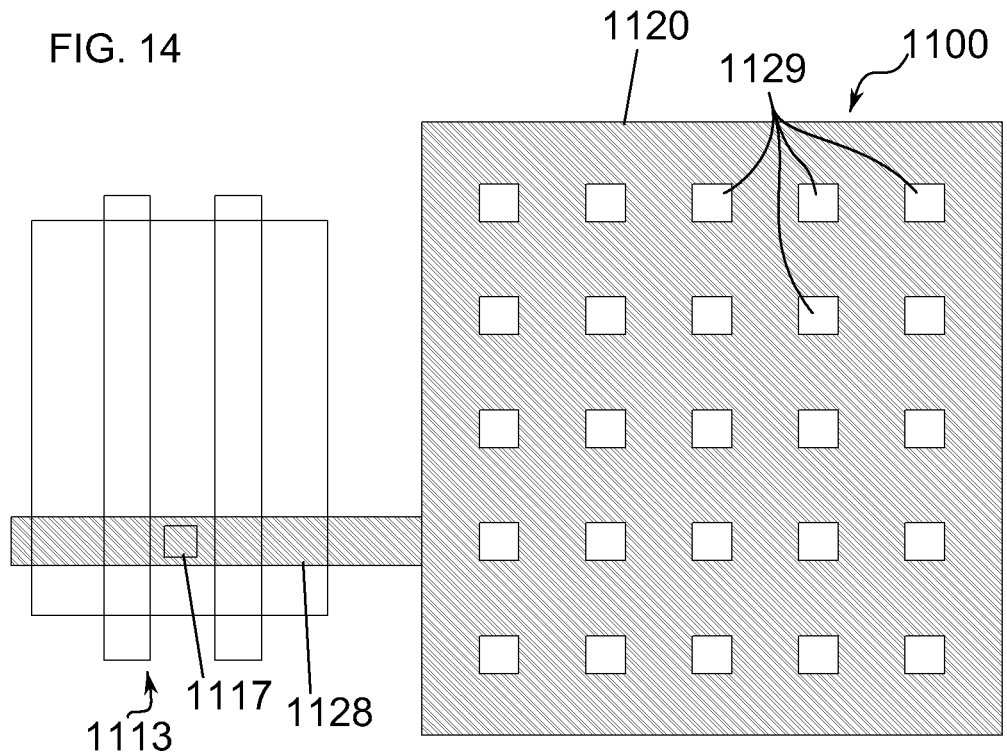
FIG. 14 is a simplified layout view of another portion of the integrated circuit assembly shown in FIG. 11 in accordance with an embodiment.

FIG. 14 illustrates that, in some embodiments, the plates of the electrically conductive connection lines 1120 may be perforated with holes 1129 to reduce capacitance to ground of the circuitry inside the Faraday cage. The size of the holes 1129 may be limited by the wavelength of the E/M radiation from electrical signals that the Faraday cage is expected to protect against. The plates of the electrically conductive connection lines 1120 may thus include various patterns of holes or pores. For example, the plates of the electrically conductive connection lines 1120 do not have to be solid layers and may include pores at irregular or regular locations. These patterns can advantageously reduce the parasitic capacitance of the plates of the electrically conductive connection lines 1120 while at the same time maintaining the efficacy of the plates of the electrically conductive connection lines 1120 in terms of its ability to screen the circuitry inside the Faraday cage from electromagnetic energy. For example, the plates of the electrically conductive connection lines 1120 could comprise a mesh having evenly spaced pores of circular or quadrilateral shape. The quadrilateral pores could be formed by intersecting strips of metallization laid out as a grid. In addition, the plates of the electrically conductive connection lines 1120 can include gaps for electrical conduits to pass through the plates of the electrically conductive connection lines 1120, e.g., electrically conductive vias that may extend from the electrically conductive connection lines 1116 inside the Faraday cage through the plates of the electrically conductive connection lines 1120 to the electrically conductive connection lines 1115 above or below the Faraday cage. To balance the efficacy of the plates of the electrically conductive connection lines 1120 against the allowance for electrically conductive vias to connect circuit elements on inside and outside the Faraday cage, the gaps for the electrically conductive vias can be designed to fit within a predetermined pattern of the plates of the electrically conductive connection lines 1120. For example, the electrically conductive vias could be formed through the pores of the plates of the electrically conductive connection lines 1120 that are already in use for limiting the parasitic capacitance of the plates of the electrically conductive connection lines 1120. As another example, the electrically conductive vias could be formed in a pattern that is removed from the immediate vicinity of the active devices 1114 inside the Faraday cage. The active devices 1114 inside the Faraday cage could be located in a central portion of the Faraday cage while the electrically conductive vias are aligned over a periphery of the plates of the electrically conductive connection lines 1120.

FIG. 14 illustrates one of the plates of the electrically conductive connection lines 1120 with a pattern of evenly spaced square holes 1129. The regularity of the pattern is not essential and is only included for illustrative purposes. The size of the square holes 1129 is set by the diagonal of the square. The efficacy of the plates of the electrically conductive connection lines 1120 can be maintained while decreasing the parasitic capacitance of the plates of the electrically conductive connection lines 1120 by controlling the size and pattern of the holes 1129.

The efficacy of the plates of the electrically conductive connection lines 1120 in relation to the size of the holes 1129 is set by the frequency of the electromagnetic interference that is being shielded. For example, at typical RF frequencies in the GHz range, holes with sizes on the order of microns can reduce parasitic capacitance while still effectively screening the active devices 1114 inside the Faraday cage from electromagnetic energy. In the context of electromagnetic interference propagating through a semiconductor device, wavelength can be expressed according to the following equation:

$$\lambda = \frac{c}{nf}$$

In this equation, $\lambda$ is wavelength, c is the speed of light, n is the refractive index of the material that is propagating the signal, and f is the frequency. The relative refractive index of silicon dioxide, for example, is about 3.9. So the wavelength of a 1 GHz wave in silicon dioxide is about 7.5 cm. The attenuation provided by an aperture is calculated from the following equation:

$$A = 20\log_{10}\left(\frac{\lambda}{2s}\right)$$

In this equation, A is attenuation, $\lambda$ is wavelength, and the aperture size is s. According to this equation, the attenuation of an opening that is 1/10 the wavelength of the signal that is being attenuated is 14 decibels. An opening that is 1/1000 the wavelength of the signal that is being attenuated provides an attenuation of 54 decibels. Thus a 7.5 μm opening compared to a 7.5 cm wavelength, for example, gives an attenuation of 54 decibels. Thus the required attenuation can be used to determine the maximum size allowable for the holes 1129. In general, a ratio of 10% between the wavelength and the size of the holes 1129 will provide a suitable figure of merit for most RF applications. However, the exact ratio depends on the requirements for the overall RF system to which the semiconductor device is a part.

In some embodiments, portions of the integrated circuit assembly 1100 may be formed by the process described above with respect to FIGS. 3 and 4. For example, formation of the integrated circuit assembly 1100 may begin with an SOI structure having the semiconductor layer 1101, the insulating layer 1102, and a substrate layer (e.g., 210, FIG. 4A). The insulating layer 1102 has a first surface in contact with the semiconductor layer 1101 and a second surface in contact with the substrate (e.g., 210) below the first surface. The semiconductor layer 1101 has a first surface in contact with the insulating layer 1102 and a second surface 236 above the first surface. The insulating layer 1102 may be comprised of, for example, silicon dioxide, and it may be, for example, between 10 and 1000 nm thick, for example, between 15 and 70 nm thick, or between 150 and 350 nm thick, or between 500 and 750 nm thick. The semiconductor layer 1101 may be comprised of, for example, silicon, or a III-V semiconductor such as GaAs, or a strained semiconductor alloy such as SiGe.

Circuit elements, for example, the active devices 1113 and 1114, are formed in the semiconductor layer 1101. The active devices 1113 and 1114 comprise source regions (e.g., 240s, FIG. 4B), drain regions (e.g., 240d), and gate layers (e.g., 240g), and are separated by isolation regions (e.g., 232). These elements may be formed as described for step 120 in FIG. 3 above; that is, using, for example, a standard CMOS process, or a bi-polar-CMOS (BiCMOS) process. Other circuit elements may be formed in addition to, or instead of, CMOS transistors (e.g., 240), for example, high-power devices, optoelectronic devices, or other passive or reactive elements. In some embodiments, the electrically conductive ring of polysilicon 1122 may also be formed along with the source and drain regions of the active devices 1113 and 1114.

The inter-level dielectric layer 1108 is then formed over the active devices 1113 and 1114. The electrically conductive vias 1117, 1118, and 1121 are also formed through the inter-level dielectric layer 1108. The electrically conductive vias 1121 that form part of the Faraday cage may be formed down to the electrically conductive ring of polysilicon 1122 (if present) or down to any appropriate depth in the semiconductor layer 1101 or the insulating layer 1102.

The first front or top side electrically conductive interconnect layer 1103 may be formed (e.g., similar to the formation of the interconnect layer 250 above) optionally coupled to the second surface of the semiconductor layer 1101 (e.g., indirectly coupled through the inter-level dielectric layer 1108), and above the circuit elements (e.g., the active devices 1113 and 1114) fabricated therein. The electrically conductive connection lines 1115 and 1116 and the ring of the electrically conductive connection line 1119 of the electrically conductive interconnect layer 1103 are thus formed, with appropriate patterning, including the openings 1127 in the ring and the electrically conductive interconnect lines 1128 disposed through the openings 1127. The ring of the electrically conductive connection line 1119 thus surrounds a region of the electrically conductive interconnect layer 1103 above the region of the semiconductor layer 1101 containing the active devices 1114. The inter-level dielectric layer 1108 separates the electrically conductive interconnect layer 1103 from the active devices 1113 and 1114 formed in the semiconductor layer 1101.

The process for forming inter-layer dielectric layers, electrically conductive vias, and electrically conductive interconnect layers is repeated for as many electrically conductive interconnect layers (e.g., 1104, 1105, 1123, etc.) as are needed. All of the necessary front or top side rings of the electrically conductive connection lines 1119 and the front or top side plate of the electrically conductive connection line 1120 are thus formed. A layer 1130 (e.g., of insulation, passivation or bonding material) may optionally be placed over the topmost electrically conductive interconnect layer.

The handle wafer/layer 1112 (e.g., similar to handle layer 260 above) is coupled or bonded to the top or second surface of the semiconductor layer 1101, with the various inter-level dielectric layers (e.g., 1108-1110, 1124, etc.), the front or top side electrically conductive interconnect layers (e.g., 1103-1105, 1123, etc.), and the layer 1130 intervening. The handle wafer/layer 1112 may include a substrate 1131 and a bonding layer 1132. The bonding layer 1132, if needed, may be used to bond to the top or second surface of the wafer containing the semiconductor layer 1101. The handle wafer/layer 1112 is thus placed above all of the electrically conductive interconnect layers of the integrated circuit assembly 1100.

The handle wafer/layer 1112 is generally capable of providing sufficient strength for the integrated circuit assembly 1100 that the substrate (e.g., 210) is not needed. Therefore, as described above, the assembly is inverted and the substrate (e.g., 210) of the SOI structure is removed. This step exposes the bottom, back side or second surface of the insulating layer 1102.

Holes, as described above, are then etched through the insulating layer 1102 for the first bottom or back side electrically conductive vias 1117, 1118, and 1121. The holes for the electrically conductive vias 1121 for the Faraday cage may be etched to the electrically conductive ring of polysilicon 1122, to the first front or top side ring of the electrically conductive connection line 1119 or to the first front or top side electrically conductive vias 1121.

The first bottom or back side electrically conductive interconnect layer 1106 is formed on the second surface of the insulating layer 1102 and inside the holes for first bottom or back side electrically conductive vias 1117, 1118, and 1121. The process for forming inter-layer dielectric layers, electrically conductive vias, and electrically conductive interconnect layers is repeated for as many electrically conductive interconnect layers (e.g., 1106, 1107, 1125, etc.) as are needed. All of the necessary bottom or back side rings of the electrically conductive connection lines 1119 and the bottom or back side plate of the electrically conductive connection line 1120 (with or without the capacitance-reducing holes 1129) are thus formed. A layer 1133 (e.g., of insulation or passivation material) may optionally be placed over the bottommost electrically conductive interconnect layer.

Since the handle wafer/layer 1112 is added after the front or top side electrically conductive interconnect layers (e.g., 1103-1105, 1123, etc.) have been formed, and since the substrate (e.g., 210) of the original SOI structure is removed, all of the electrically conductive interconnect layers (e.g., metallization or conductive polysilicon) are located on one side of the overall wafer, or the integrated circuit assembly 1100. Thus, no metallization on the exposed side of the handle wafer/layer 1112 is required. In other words, all metal or electrically conductive connection lines are on one side of the wafer. This feature is advantageous because the final wafer can be thinned at the end of processing to any desired thickness by thinning the substrate 1131 of the handle wafer/layer 1112. Also, die handling is simpler, because if metal were present on the back of the die, care would have to be taken not to scratch the back side metal during wafer and die handling. Also, if the singulated die were placed on a package with a metal leadframe, all back side metal would be shorted to the same potential, thereby reducing flexibility of circuit design.

Additionally, in the integrated circuit assembly 1100, since the substrate (e.g., 210) of the original SOI structure is removed, the material contained inside the Faraday cage is substantially or primarily composed of the active structures, with a minimum of other or additional material. Very little, if any, semiconductor substrate material is included within the Faraday cage. The mechanical substrate 1131 that provides the structural integrity of the resulting chip is outside the Faraday cage. Additionally, the insulating layer 1102 may optionally be thinned in some embodiments. In this manner, the volume or size of the Faraday cage is minimized, thereby minimizing the exposure of the contained structures to external E/M influences.

Additionally, in the integrated circuit assembly 1100, no metallization passes through a semiconductor substrate. Therefore, the formation of the vias and interconnects is relatively simple.

Furthermore, in the integrated circuit assembly 1100, no TSVs (i.e., through silicon/semiconductor vias) are required. TSV structures usually have large design rules because they extend for many microns through the mechanical substrate. Without TSVs, however, smaller volumes of material can be contained in separate Faraday cages.

Additionally, in the integrated circuit assembly 1100, no portion of a packaging is required to form any part of the Faraday cage. Instead, the Faraday cage is fully integrated into the chip or die, so any appropriate packaging design can be used.

The back-side interconnect processes described herein are applicable to many different types of SOI fabrication processes, for example, fully-depleted or partially-depleted SOI processes. Also, multiple layers of metal interconnect may be used on the front or back side of the transferred layer, by, for example, repeating the applicable steps described herein.

While the specification has been described in detail with respect to specific embodiments of the invention, it will be appreciated that those skilled in the art, upon attaining an understanding of the foregoing, may readily conceive of alterations to, variations of, and equivalents to these embodiments. These and other modifications and variations to the present invention may be practiced by those of ordinary skill in the art, without departing from the spirit and scope of the present invention. Furthermore, those of ordinary skill in the art will appreciate that the foregoing description is by way of example only, and is not intended to limit the invention. Thus, it is intended that the present subject matter covers such modifications and variations.

What is claimed is:

1. An integrated circuit assembly comprising:
    an insulating layer having a first surface and a second surface, the second surface being below the first surface, wherein a substrate layer has been removed from the second surface;
    a semiconductor layer having a first surface and a second surface, the first surface of the semiconductor layer contacting the first surface of the insulating layer;
    an active device formed in a region of the semiconductor layer;
    a first electrically conductive interconnect layer forming an electrically conductive ring;
    a second electrically conductive interconnect layer forming a first electrically conductive plate above the electrically conductive ring and the region of the semiconductor layer;
    a third electrically conductive interconnect layer forming a second electrically conductive plate below (i) the electrically conductive ring, (ii) the insulating layer, and (iii) the region of the semiconductor layer; and
    a plurality of electrically conductive vias electrically coupling the electrically conductive ring to the first electrically conductive plate and to the second electrically conductive plate;
    wherein the electrically conductive ring, the first electrically conductive plate, the second electrically conductive plate, and the plurality of electrically conductive vias form a Faraday cage around the active device.

2. The integrated circuit assembly of claim 1, wherein:
    the electrically conductive ring surrounds a region above the region of the semiconductor layer.

3. The integrated circuit assembly of claim 1, wherein:
    the electrically conductive ring comprises an opening therein;
    the first electrically conductive interconnect layer further comprises an electrically conductive connection line disposed through the opening in the electrically conductive ring; and
    the electrically conductive connection line electrically connects the first active device to a second active device in a second region of the semiconductor layer outside the Faraday cage.

4. The integrated circuit assembly of claim 1, further comprising:
    a fourth electrically conductive interconnect layer connected to the second surface of the insulating layer and forming a second electrically conductive ring around a sub-insulator region below the region of the semiconductor layer;
    wherein:
    the first electrically conductive interconnect layer is located above the second surface of the semiconductor layer;
    the first electrically conductive ring surrounds an upper region above the region of the semiconductor layer;
    the plurality of electrically conductive vias electrically couples the first electrically conductive ring to the second electrically conductive plate through the second electrically conductive ring; and
    the first electrically conductive ring, the first electrically conductive plate, the second electrically conductive plate, the second electrically conductive ring, and the plurality of electrically conductive vias form the Faraday cage around the active device.

5. The integrated circuit assembly of claim 4, wherein:
    the second electrically conductive ring comprises an opening therein;
    the fourth electrically conductive interconnect layer further comprises an electrically conductive connection line disposed through the opening in the second electrically conductive ring; and
    the electrically conductive connection line electrically connects the first active device to a second active device in a second region of the semiconductor layer outside the Faraday cage.

6. The integrated circuit assembly of claim 4, further comprising:
    a fifth electrically conductive interconnect layer forming a third electrically conductive ring between the first electrically conductive ring and the first electrically conductive plate;

wherein:
the plurality of electrically conductive vias electrically couples the first electrically conductive ring to the first electrically conductive plate through the third electrically conductive ring; and the first electrically conductive ring, the first electrically conductive plate, the second electrically conductive plate, the second electrically conductive ring, the third electrically conductive ring, and the plurality of electrically conductive vias form the Faraday cage around the active device.

7. The integrated circuit assembly of claim 6, further comprising:
a sixth electrically conductive interconnect layer forming a fourth electrically conductive ring between the second electrically conductive ring and the second electrically conductive plate;
wherein:
the plurality of electrically conductive vias electrically couples the second electrically conductive ring to the second electrically conductive plate through the fourth electrically conductive ring; and the first electrically conductive ring, the first electrically conductive plate, the second electrically conductive plate, the second electrically conductive ring, the third electrically conductive ring, the fourth electrically conductive ring, and the plurality of electrically conductive vias form the Faraday cage around the active device.

8. The integrated circuit assembly of claim 1, wherein:
the first electrically conductive plate and the second electrically conductive plate are perforated with a set of holes that reduce a capacitance to ground of the active device.

9. The integrated circuit assembly of claim 1, further comprising:
a second electrically conductive ring surrounding the region of the semiconductor layer and consisting of polysilicon;
wherein:
the plurality of electrically conductive vias also electrically couple the first electrically conductive ring to the second electrically conductive ring;
wherein the first electrically conductive ring, the first electrically conductive plate, the second electrically conductive plate, the second electrically conductive ring, and the plurality of electrically conductive vias form the Faraday cage around the active device.

10. The integrated circuit assembly of claim 1, further comprising:
a bonded handle wafer having a substrate above all of the electrically conductive interconnect layers.

* * * * *